United States Patent
Reznicek et al.

(10) Patent No.: US 11,164,787 B2
(45) Date of Patent: Nov. 2, 2021

(54) TWO-STAGE TOP SOURCE DRAIN EPITAXY FORMATION FOR VERTICAL FIELD EFFECT TRANSISTORS ENABLING GATE LAST FORMATION

(71) Applicant: INTERNATIONAL BUSINESS MACHINES CORPORATION, Armonk, NY (US)

(72) Inventors: Alexander Reznicek, Troy, NY (US); Chun-Chen Yeh, Danbury, CT (US); Zuoguang Liu, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/720,060

(22) Filed: Dec. 19, 2019

(65) Prior Publication Data

US 2021/0193527 A1    Jun. 24, 2021

(51) Int. Cl.
   *H01L 29/66*   (2006.01)
   *H01L 21/8234*   (2006.01)
   *H01L 21/8238*   (2006.01)
   *H01L 29/78*   (2006.01)

(52) U.S. Cl.
   CPC ........... *H01L 21/823418* (2013.01); *H01L 21/823487* (2013.01); *H01L 21/823864* (2013.01); *H01L 29/66666* (2013.01); *H01L 29/7827* (2013.01)

(58) Field of Classification Search
   CPC .............. H01L 29/7827; H01L 29/66666
   See application file for complete search history.

(56) References Cited

U.S. PATENT DOCUMENTS

| | | |
|---|---|---|
| 8,058,137 B1 | 11/2011 | Or-Bach |
| 9,595,611 B2 | 3/2017 | Kim |
| 9,711,618 B1 | 7/2017 | Cheng |
| 9,806,173 B2 | 10/2017 | Balakrishnan |
| 9,954,102 B1 | 4/2018 | Mochizuki |
| 9,972,494 B1 | 5/2018 | Bentley |
| 10,084,080 B2 | 9/2018 | Liu |
| 10,164,057 B1 | 12/2018 | Jeon |
| 10,170,619 B2 | 1/2019 | Balakrishnan |
| 10,199,464 B2 | 2/2019 | Cheng |
| 10,319,836 B1 | 6/2019 | Reznicek |

(Continued)

OTHER PUBLICATIONS

Horiguchi et al., "Patterning challenges in advanced device architectures: FinFETs to nanowires", In Advanced Etch Technology for Nanopatterning V, vol. 9782, International Society for Optics and Photonics, Event: SPIE Advanced Lithography, 2016, San Jose, California, United States, 11 pages, Proceedings of SPIE.

(Continued)

*Primary Examiner* — Zandra V Smith
*Assistant Examiner* — Molly K Reida
(74) *Attorney, Agent, or Firm* — L. Jeffrey Kelly

(57) ABSTRACT

A semiconductor structure including a bottom source drain region arranged on a substrate, a semiconductor channel region extending vertically upwards from a top surface of the bottom source drain region, a metal gate disposed on and around the semiconductor channel region, and a top source drain region above the semiconductor channel region and comprising a first doped epitaxy region and a second doped epitaxy region.

20 Claims, 25 Drawing Sheets

(56) References Cited

U.S. PATENT DOCUMENTS

| | | |
|---|---|---|
| 10,373,912 B2 | 8/2019 | Lee |
| 10,388,766 B2 | 8/2019 | Mochizuki |
| 2011/0049577 A1 | 3/2011 | Or-Bach |
| 2017/0207217 A1 | 7/2017 | Hellings |
| 2017/0213900 A1 | 7/2017 | Cheng |
| 2018/0114859 A1* | 4/2018 | Gluschenkov ...... H01L 29/7827 |
| 2018/0151737 A1 | 5/2018 | Yang |
| 2018/0366373 A1 | 12/2018 | Li |
| 2019/0006491 A1 | 1/2019 | Lee |

OTHER PUBLICATIONS

Veloso et al., "Advances on doping strategies for triple-gate finFETs and lateral gate-all-around nanowire FETs and their impact on device performance", Materials Science in Semiconductor Processing, 62, (2017), 11 pages.

* cited by examiner

TWO-STAGE TOP SOURCE DRAIN EPITAXY FORMATION FOR VERTICAL FIELD EFFECT TRANSISTORS ENABLING GATE LAST FORMATION

BACKGROUND

The present invention generally relates to semiconductor manufacturing, and more particularly to vertical field effect transistors.

Vertical transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

SUMMARY

According to one embodiment of the present invention, a vertical transistor device is provided. The vertical transistor device includes a bottom source drain region arranged on a substrate, a semiconductor channel region extending vertically upwards from a top surface of the bottom source drain region, a metal gate disposed on and around the semiconductor channel region, and a top source drain region above the semiconductor channel region and comprising a first doped epitaxy region and a second doped epitaxy region.

According to one embodiment of the present invention, a vertical transistor device is provided. The vertical transistor device includes a bottom source drain region arranged on a substrate, a semiconductor channel region extending vertically upwards from a top surface of the bottom source drain region, a metal gate disposed on and around the semiconductor channel region, a top source drain region above the semiconductor channel region and comprising a first epitaxy region and a second epitaxy region, and a dielectric spacer disposed on the metal gate beneath the second epitaxy region, the dielectric spacer contacts vertical sidewalls of the metal gate and vertical sidewalls of the first epitaxy region.

According to one embodiment of the present invention, a method of forming a vertical transistor device is provided. The method includes forming a bottom source drain region on a substrate, forming a semiconductor channel region extending vertically upwards from a top surface of the bottom source drain region, forming a metal gate disposed on and around the semiconductor channel region; and forming a top source drain region above the semiconductor channel region, the top source drain region comprises a first epitaxy region and a second epitaxy region.

BRIEF DESCRIPTION OF THE DRAWINGS

The following detailed description, given by way of example and not intended to limit the invention solely thereto, will best be appreciated in conjunction with the accompanying drawings, in which.

Figure 1:
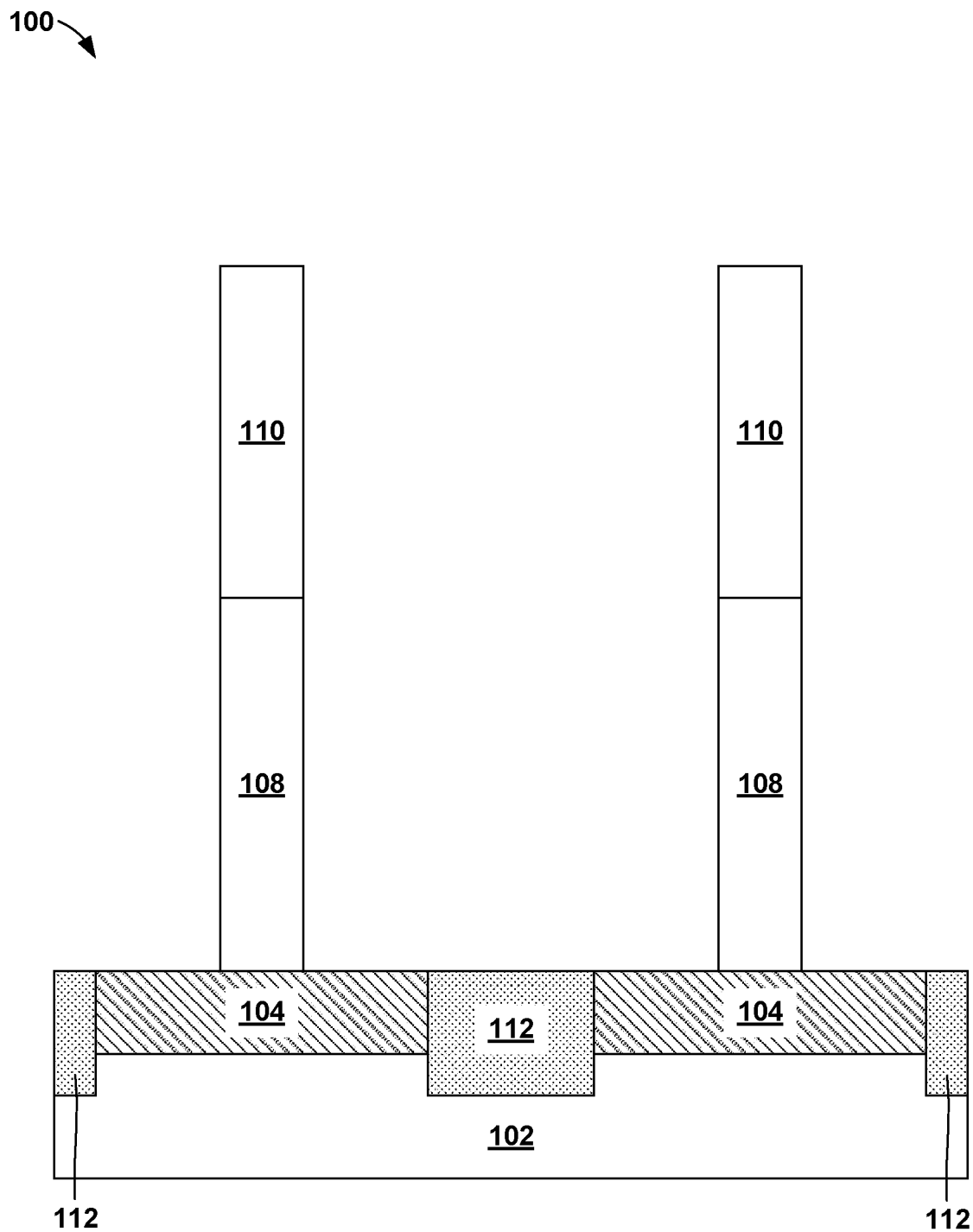
FIG. 1 is a cross-sectional view of a semiconductor structure during an intermediate step of a method of fabricating a vertical transistor with a two-stage top source drain epitaxy according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor manufacturing, and more particularly to vertical field effect transistors. One way to manufacture a vertical field effect transistor may include manufacturing a top source drain region in two stages. One embodiment by which to manufacture the two-stage top source drain region is described in detail below by referring to the accompanying drawings in FIGS. 1 to 26. Those skilled in the art will readily appreciate that the detailed description given herein with respect to these figures is for explanatory purposes as the invention extends beyond these limited embodiments.

Referring now to FIG. 1, a structure 100 is shown during an intermediate step of a method of fabricating a vertical transistor with a two-stage top source drain epitaxy according to an embodiment of the invention. The structure 100 illustrated in FIG. 1 includes a semiconductor substrate 102 (hereinafter "substrate") having bottom source drain regions 104, semiconductor fins 108, and shallow trench isolation regions 112 (hereinafter "STI regions") formed thereon.

The substrate 102 is shown and may be formed from any appropriate material including, e.g., bulk semiconductor or a semiconductor-on-insulator layered structure. Illustrative examples of suitable materials for the substrate 102 include, but are not limited to, silicon, silicon germanium, carbon dope silicon germanium, carbon doped silicon, polysilicon, epitaxial silicon, amorphous silicon, and multi-layers thereof. Although silicon is the predominantly used semiconductor material in wafer fabrication, alternative semiconductor materials can be employed, such as, but not limited to, gallium arsenide, indium phosphide, indium gallium arsenide, indium arsenide, gallium, cadmium telluride and zinc sellenide.

In the present embodiment, the substrate 102 is a bulk semiconductor substrate. By "bulk" it is meant that the semiconductor substrate 102 is entirely composed of at least one of the above materials listed above. In an embodiment, the substrate 102 can be entirely composed of silicon. In other embodiments, the semiconductor substrate 102 may include a multilayered semiconductor material stack including at least two different semiconductor materials, as defined above. In an embodiment, the multilayered semiconductor material stack may include, in any order, a stack of silicon and a silicon germanium alloy. In another embodiment, the semiconductor substrate 102 may include a single crystalline semiconductor material. Such single crystal materials may have any of the well-known crystal orientations. For example, the crystal orientation of the semiconductor substrate 102 may be {100}, {110}, or {111}. Other crystallographic orientations besides those specifically mentioned can also be used in the present application.

The bottom source drain regions 104 are epitaxially grown within trenches formed in the substrate 102. It should be understood that the bottom source drain regions 104 may be either one of a source region or a drain region, as appropriate. Illustrative examples of suitable materials for the bottom source drain regions 104 include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

The bottom source drain regions 104 may be doped with dopant atoms. The bottom source drain regions 104 may be in-situ doped as it is deposited on the substrate 102 or, alternatively, may be doped through an implantation technique. The dopant atoms may be an n-type dopant or a p-type dopant. Exemplary n-type dopants include phosphorus, arsenic antimony, selenium, tellurium, silicon, and germanium. Exemplary p-type dopants include beryllium, zinc, cadmium, silicon, germanium, boron, aluminum, and gallium. In an embodiment, the bottom source drain regions 104 are made from doped Si:C(P) (for n-type devices) or SiGe:B (for p-type devices), with dopant concentrations ranging from approximately $2\times10^{20}$ to approximately $2.5\times10^{21}$ atoms/cm2, with a dopant concentration ranging from approximately $4\times10^{20}$ to approximately $2\times10^{21}$ atoms/cm2 being more typical.

In another embodiment, the bottom source drain regions 104 may be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenide, indium arsenide, indium antimonide, indium phosphide, aluminum arsenide, indium gallium arsenide, indium aluminum arsenide, indium aluminum arsenide antimonde, indium aluminum arsenide phosphorude, indium gallium arsenide phosphorude and combinations thereof. In an embodiment, the bottom source drain regions 104 are made from doped III-V semiconductor materials with dopant concentrations ranging from approximately $1\times10^{18}$ to approximately $1\times10^{20}$ atoms/cm2, with a dopant concentration ranging from approximately $5\times10^{18}$ to approximately $8\times10^{19}$ atoms/cm2 being more typical.

The semiconductor fins 108 are formed from a semiconductor layer (not shown), and form the channel of the vertical transistor device depicted by the structure 100. First, masks 110 are deposited on the semiconductor layer. The masks 110 define regions for the semiconductor fins 108. The semiconductor layer is etched or patterned using an anisotropic etch such as, for example, reactive ion etching, to remove material that is not covered by the masks 110 to form semiconductor fins 108. Although the present application describes and illustrates the formation of two semiconductor fins 108 that are capped with the mask 110, the present application can be employed when a single hard mask capped semiconductor fin structure is formed, or when more than two hard mask capped semiconductor fin structures are formed.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each semiconductor fin 108 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each semiconductor fin 108 is spaced apart from its nearest neighboring semiconductor fin 108 by a pitch ranging from approximately 20 nm to approximately 100 nm; the pitch is measured from one point of one semiconductor fin to the exact point on a neighboring semiconductor fin. Also, each semiconductor fin 108 is oriented parallel to each other. Each semiconductor fin 108 extends upward from a top surface of the bottom source drain regions 104.

The STI regions 112 are penetrate the bottom source drain regions 104 and extend partially into the substrate 102. First, trenches are formed by any appropriate technique, for example an anisotropic etch or machining. Next, the trenches are filled with a dielectric material to form the STI regions 112. The STI regions 112 may be formed from any appropriate dielectric including, for example, silicon oxide ($SiO_x$) or silicon nitride ($Si_xN_y$).

Figure 2:
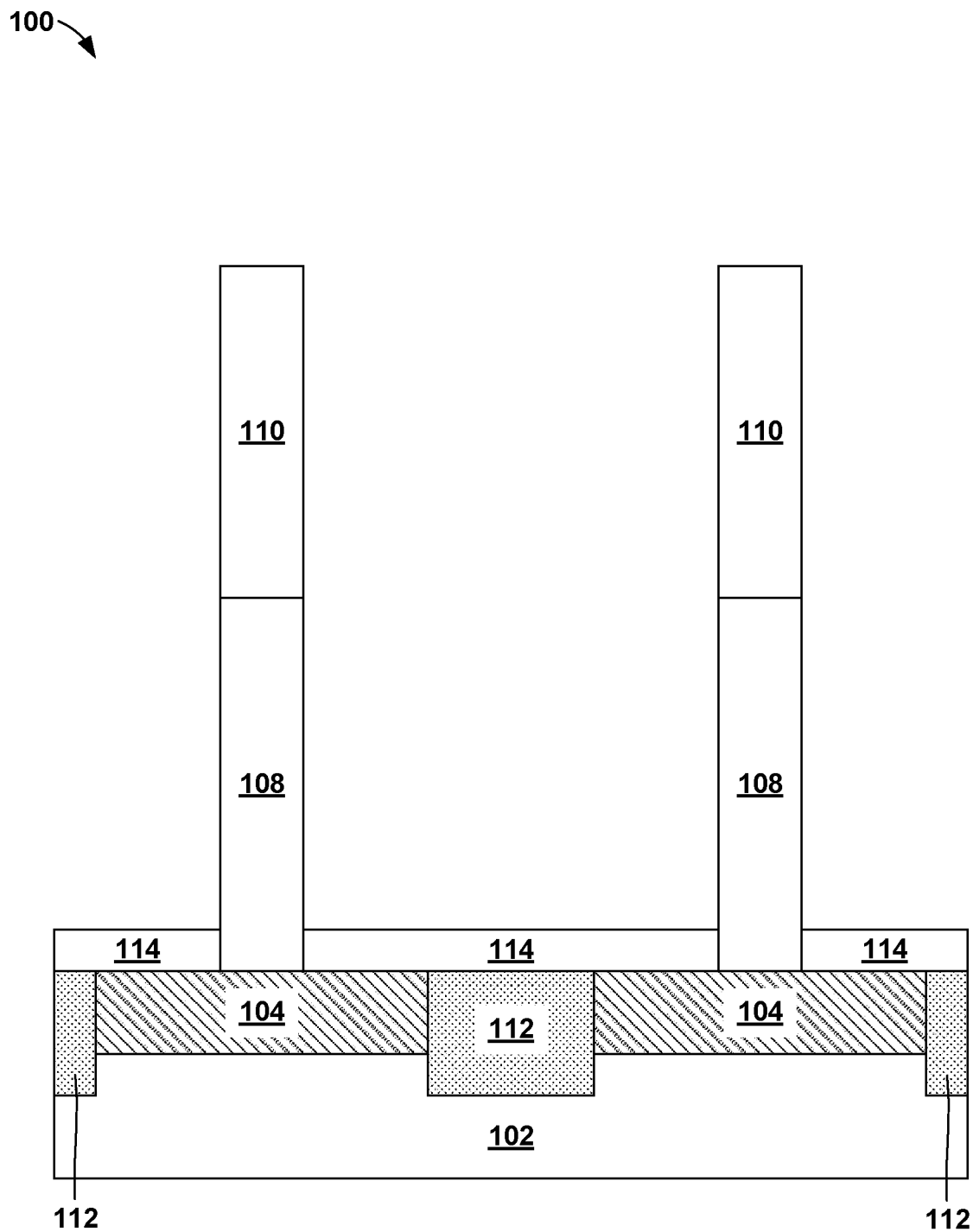
FIG. 2 is a cross-sectional view of a semiconductor structure after forming bottom spacers according to an exemplary embodiment.

Referring now to FIG. 2, the structure 100 is shown after forming bottom spacers 114 in accordance with an embodiment of the present invention. As is shown, the bottom spacers 114 contact sidewall surfaces of a lower portion of the at least one semiconductor fin 108. The bottom spacers 114 have a height, or thickness, that is less than a height of each semiconductor fin 108. Stated differently, topmost surfaces of the bottom spacers 114 are vertically offset and located beneath topmost surfaces of each mask 110.

The bottom spacers 114 are deposited on a top surface of the bottom source drain regions 104. It is specifically contemplated that the bottom spacers 114 are deposited in an anisotropic manner, without accumulation on the sidewalls of the semiconductor fins 108. This may be accomplished using, e.g., gas cluster ion beam (GCM) deposition, where the surface is bombarded by high-energy cluster ions. In alternative embodiments, other deposition techniques may be used to form the bottom spacers 114 only on the horizontal surfaces.

Alternatively, the bottom spacers 114 can be formed by first depositing a blanket dielectric layer following by a recess etch to remove a portion of the blanket dielectric layer. The recess etch removes a portion of the blanket dielectric layer until the bottom spacers 114 remains. In such cases, the chosen dielectric material is etched selective to the masks 110 and the semiconductor fins 108. In an example, when the blanket dielectric layer is silicon oxide ($SiO_x$) and the masks 110 are silicon nitride ($Si_xN_y$), a hydrofluoric acid or a buffered oxide etchant (i.e., a mixture of ammonium fluoride and hydrofluoric acid) may be used during the recess etch technique.

Suitable spacer materials include, but are not limited to, oxides such as silicon oxide ($SiO_x$), nitrides such as silicon nitride ($Si_xN_y$), and/or low-κ materials such as carbon-doped oxide materials containing silicon (Si), carbon (C), oxygen (O), and hydrogen (H) (SiCOH) or siliconborocarbonitride (SiBCN). The term "low-κ" as used herein refers to a material having a relative dielectric constant κ which is lower than that of silicon dioxide.

In an embodiment, the bottom spacers 114 include any dielectric material that is different, in terms of composition and etch rate, than certain other subsequently formed dielectric materials (e.g. first sacrificial dielectric layer 116) described in detail below. For example, when the bottom spacers 114 are silicon nitride ($Si_xN_y$), subsequently formed oxides may be removed selective to the bottom spacers 114.

Figure 3:
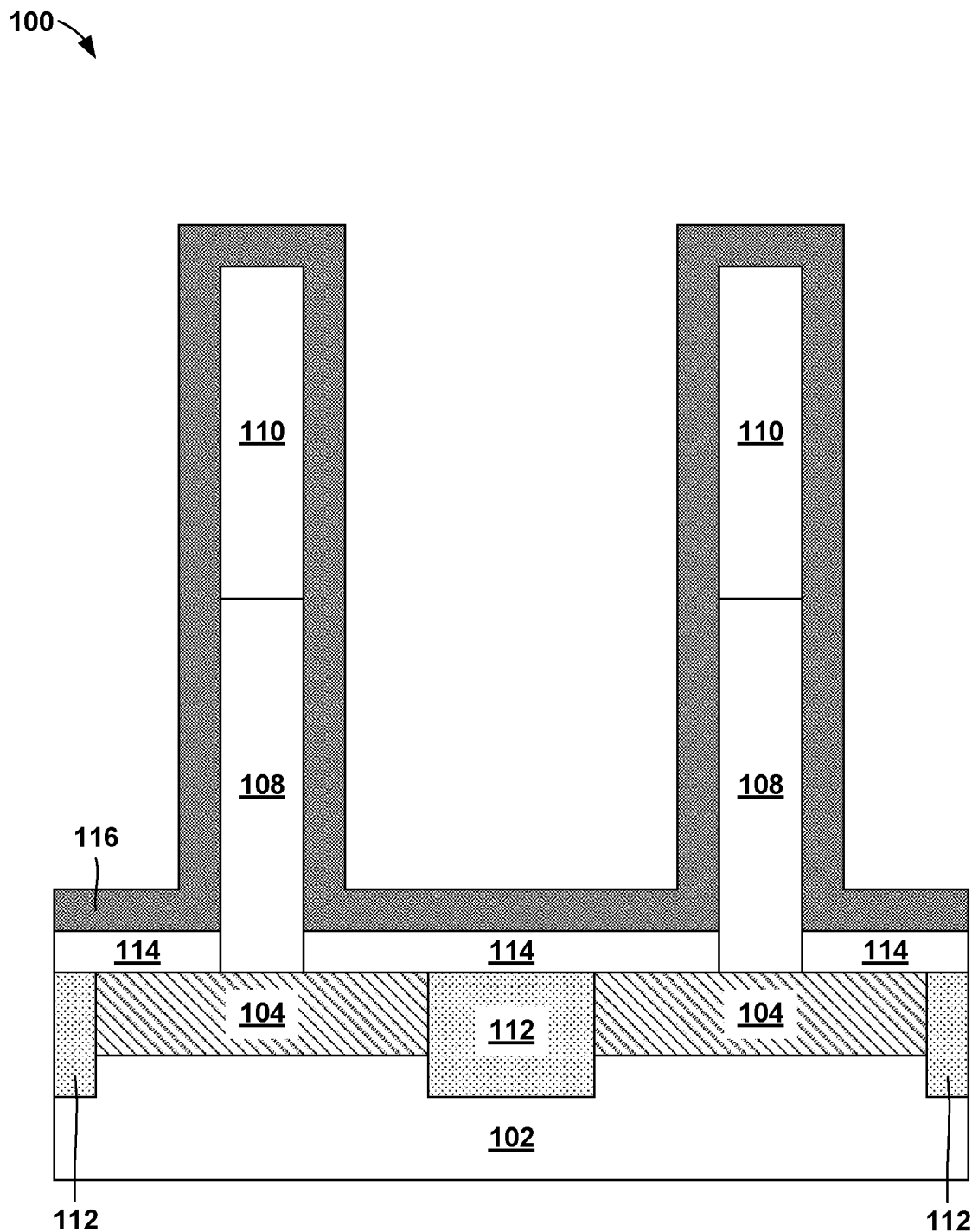
FIG. 3 is a cross-sectional view of a semiconductor structure after depositing a first sacrificial dielectric layer according to an exemplary embodiment.

Referring now to FIG. 3, the structure 100 is shown after depositing a first sacrificial dielectric layer 116 in accordance with an embodiment of the present invention. The first sacrificial dielectric layer 116 is a continuous layer that is formed on physically exposed surfaces of the structure 100. Specifically, the first sacrificial dielectric layer 116 is deposited on exposed surfaces of the semiconductor fins 108, the masks 110, and the bottom spacers 114.

In an embodiment, the first sacrificial dielectric layer 116 is a conformal layer. By "conformal" it is meant that a material layer has a first thickness as measured from a bottom surface to a topmost surface that is the same as a second thickness as measured from an inner sidewall surface to an outer sidewall surface. In another embodiment, the first sacrificial dielectric layer 116 may be a non-conformal layer. The first sacrificial dielectric layer 116 may be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. In either embodiment, the first sacrificial dielectric layer 116 does not entirely fill in the opening that remains between each neighboring semiconductor fin 108.

The first sacrificial dielectric layer 116 is composed of any dielectric material that is different, in terms of composition and etch rate, than the dielectric materials of either the masks 110 or the bottom spacers 114. In an example, both the bottom spacers 114 and the masks 110 are silicon nitride ($Si_xN_y$), while the first sacrificial dielectric layer 116 is silicon oxide ($SiO_x$). As such, the first sacrificial dielectric layer 116 can be removed or etched selective to the bottom spacers 114, the masks 110, or both.

Figure 4:
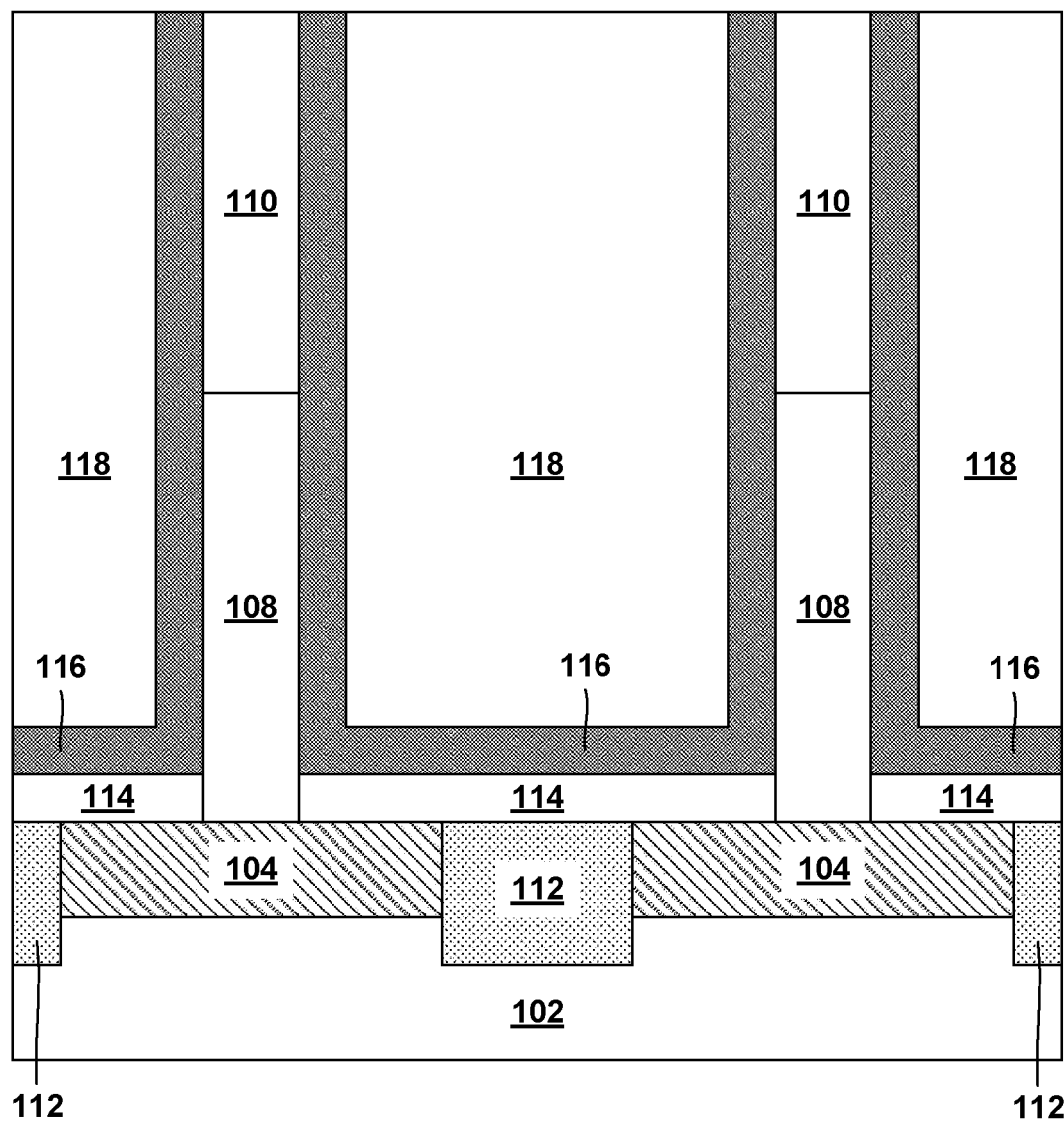
FIG. 4 is a cross-sectional view of a semiconductor structure after depositing a sacrificial gate layer according to an exemplary embodiment.

Referring now to FIG. 4, the structure 100 is shown after depositing a sacrificial gate layer 118 in accordance with an embodiment of the present invention. The sacrificial gate layer 118 is deposited on an exposed surface of the first sacrificial dielectric layer 116. The sacrificial gate layer 118 includes any material having a different etch rate than at least the first sacrificial dielectric layer 116 such as, for example, amorphous polysilicon. The sacrificial gate layer 118 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

After deposition, a planarization technique such as, for example, chemical mechanical planarization (CMP) and/or grinding is applied. The planarization technique removes excess material of the sacrificial gate layer 118 that extends above the masks 110, while leaving a portion of the sacrificial gate layer 118 in the space between and surrounding the semiconductor fins 108. After polishing an upper surface of the sacrificial gate layer 118 is flush, or substantially flush, with an upper surface of the masks 110.

Figure 5:
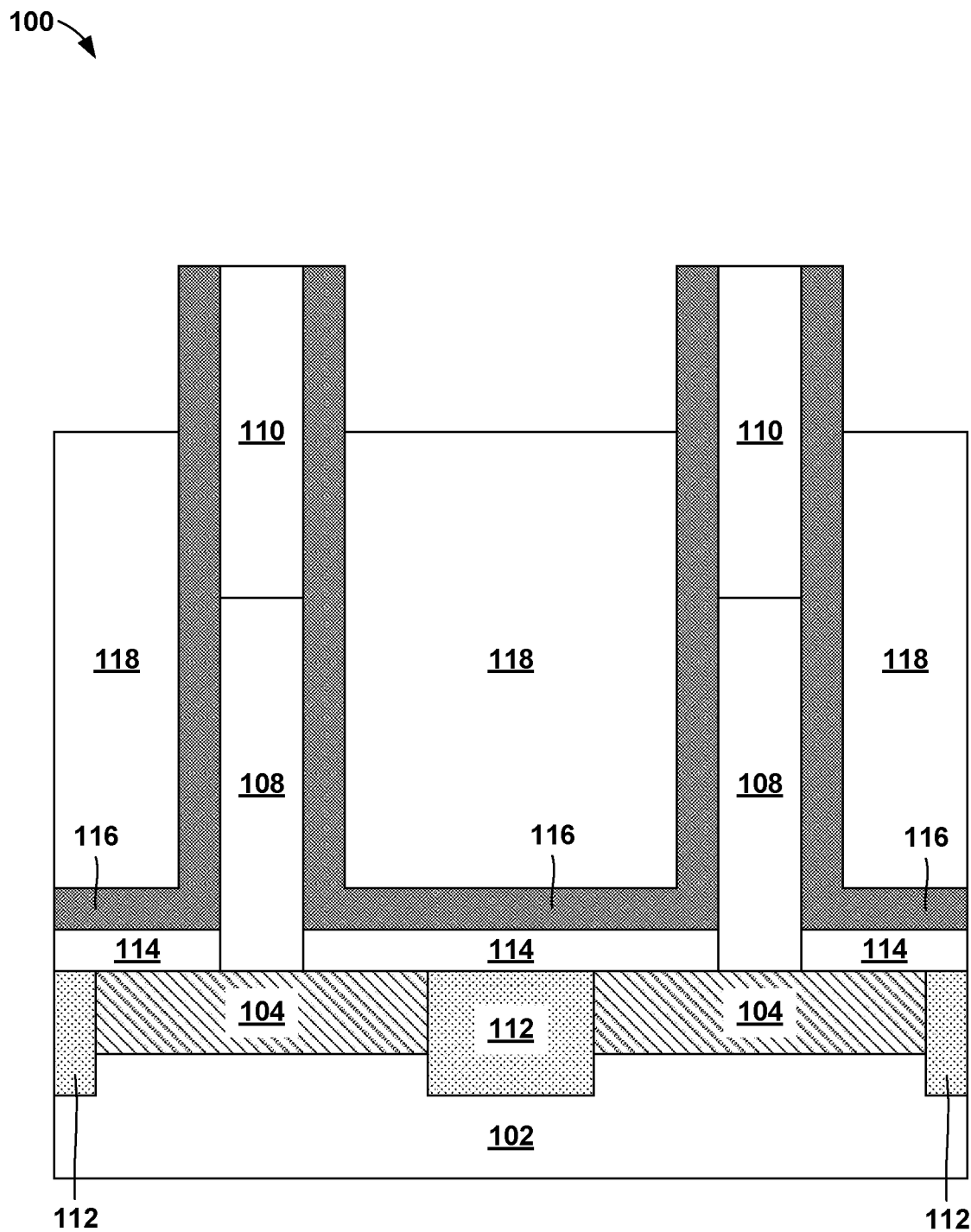
FIG. 5 is a cross-sectional view of a semiconductor structure after recessing the sacrificial gate layer according to an exemplary embodiment.

Referring now to FIG. 5, the structure 100 is shown after recessing the sacrificial gate layer 118 in accordance with an embodiment of the present invention. The recessing performed in this step of the present application uses the vertical sidewall sacrificial dielectric layer 116 and the masks 110 as an etch mask. The removal may be performed using at least one anisotropic etching technique. After performing the etch, portions of the sacrificial gate layer 118 remain and upper portions of the sacrificial dielectric layer 116 are exposed.

Figure 6:
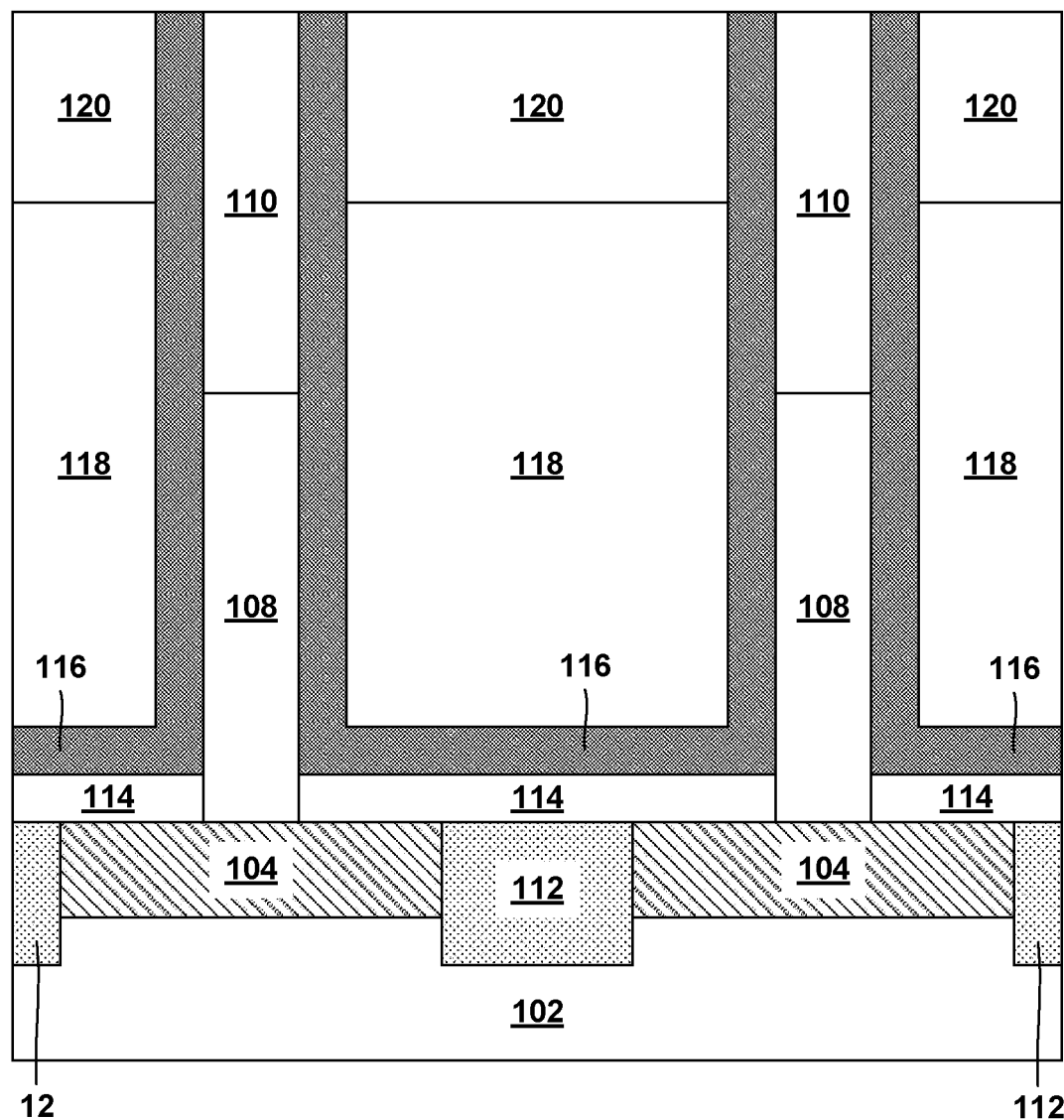
FIG. 6 is a cross-sectional view of a semiconductor structure after depositing a second sacrificial dielectric layer according to an exemplary embodiment.

Referring now to FIG. 6, the structure 100 is shown after depositing a second sacrificial dielectric layer 120 in accordance with an embodiment of the present invention. The second sacrificial dielectric layer 120 is formed on a surface of the sacrificial gate layer 118. The second sacrificial dielectric layer 120 is composed of any dielectric material that is different, in terms of composition and etch rate, than the dielectric materials of both the masks 110 and the first sacrificial dielectric layer 116. In an embodiment, and when the masks 110 are composed of silicon nitride ($Si_xN_y$). and the first sacrificial dielectric layer 116 composed of silicon nitride ($Si_xN_y$). the second sacrificial dielectric layer 120 is composed of a carbide such as, for example, silicon carbide.

The second sacrificial dielectric layer 120 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. In an embodiment, the thickness of the second sacrificial dielectric layer 120 can range from approximately 50 nm to approximately 500 nm. Other thicknesses that are lesser than 50 nm and greater than 500 nm can also be employed as the thickness of the second sacrificial dielectric layer 120.

After deposition, a planarization technique such as, for example, chemical mechanical planarization (CMP) and/or grinding is applied. The planarization technique removes excess material of the second sacrificial dielectric layer 120 and exposing topmost surfaces of the masks 110. After polishing an upper surface of the second sacrificial dielectric layer 120 is flush, or substantially flush, with an upper surface of the masks 110.

Figure 7:
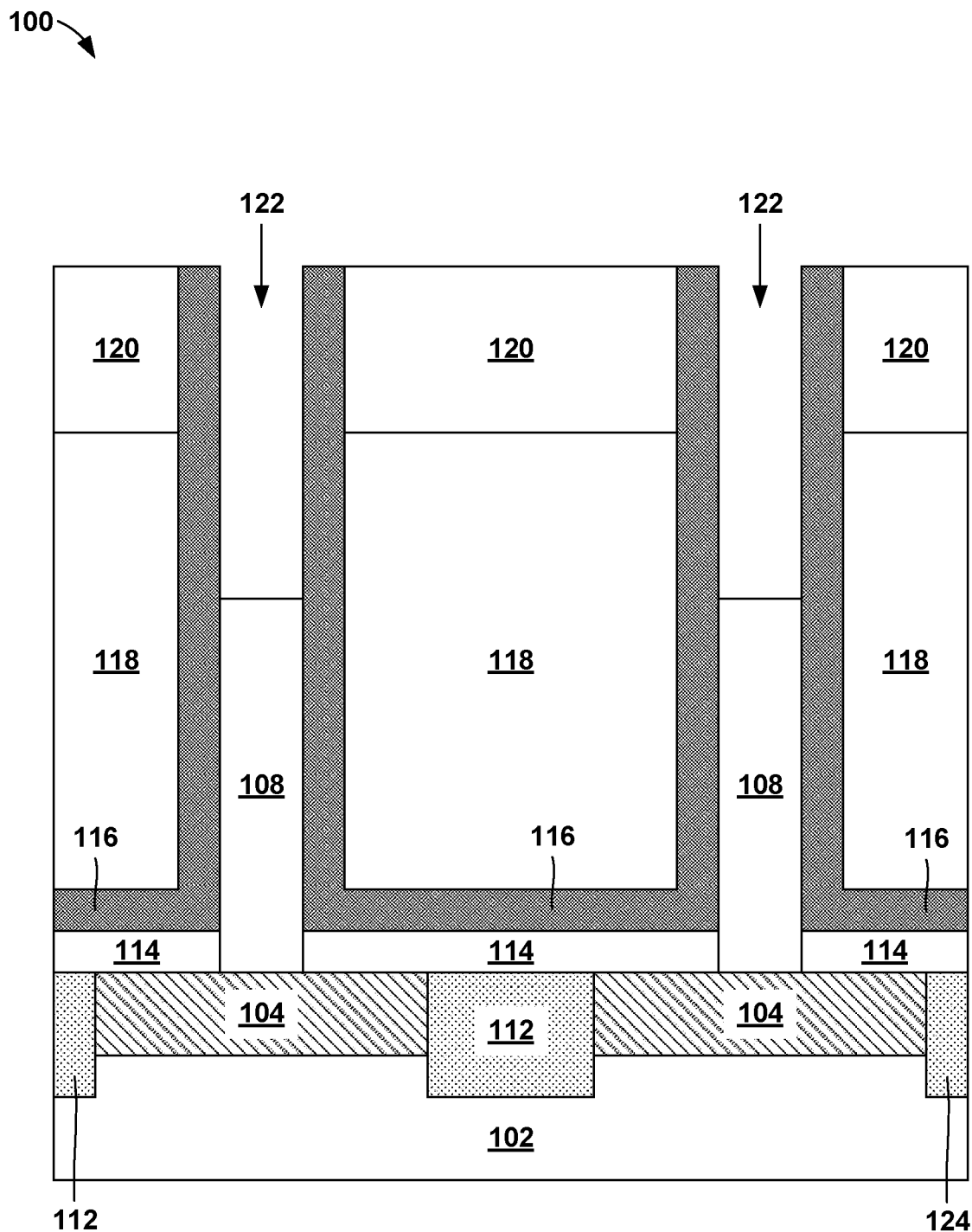
FIG. 7 is a cross-sectional view of a semiconductor structure after removing masks from atop the semiconductor fins according to an exemplary embodiment.

Referring now to FIG. 7, the structure 100 is shown after removing the masks 110 from atop the semiconductor fins 108 in accordance with an embodiment of the present invention. In doing so, an opening 122 is formed that exposes a topmost surface of the semiconductor fins 108. The removal of the masks 110 may be performed using an etch selective to the semiconductor fins 108, the first sacrificial dielectric layer 116, and the second sacrificial dielectric layer 120. In an embodiment, when the masks 110 are composed of silicon nitride ($Si_xN_y$), a hot (around 150° C. to 180° C.) phosphoric acid solution may be used to remove the masks 110 selective to the first sacrificial dielectric layer 116 and the second sacrificial dielectric layer 120.

Figure 8:
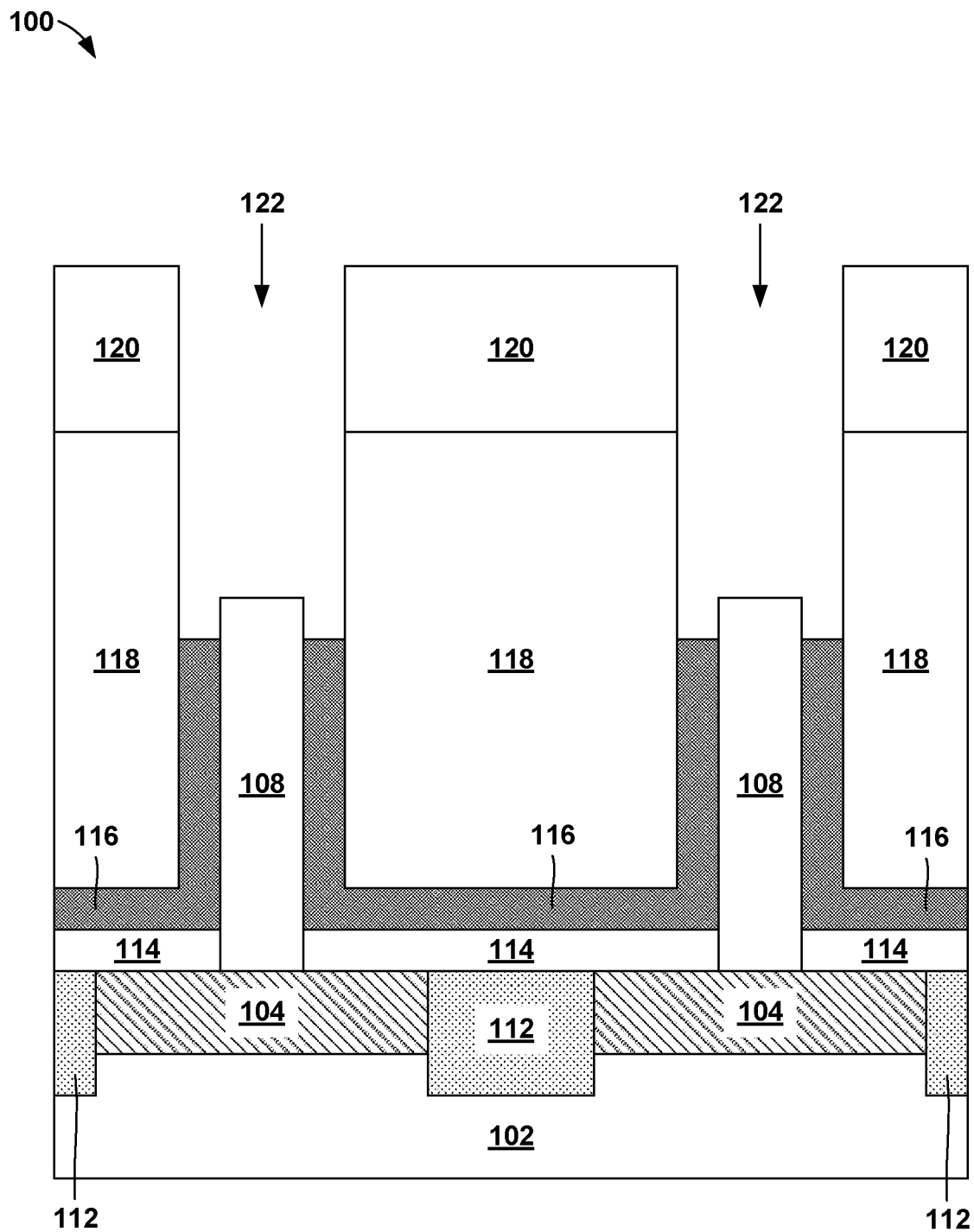
FIG. 8 is a cross-sectional view of a semiconductor structure after removing top portions of the first sacrificial dielectric layer according to an exemplary embodiment.

Referring now to FIG. 8, the structure 100 is shown after removing top portions of the first sacrificial dielectric layer 116 in accordance with an embodiment of the present invention. More specifically, the first sacrificial dielectric layer 116 is recessed such that top portions of the semiconductor fins 108 are exposed. The first sacrificial dielectric layer 116 is recessed or etched selective to the semiconductor fins 108, the sacrificial gate layer 118, and the second sacrificial dielectric layer 120. The first sacrificial dielectric layer 116 is etched using an anisotropic etch such as, for example, reactive ion etching, to remove top portions and create a void, or space, between the sacrificial gate layer 118 and the semiconductor fins 108.

After etching, upper surfaces of the first sacrificial dielectric layer 116 will be below an upper surface of the semiconductor fins 108. It is critical that the first sacrificial dielectric layer 116 is recessed below upper surface of the semiconductor fins 108 to ensure isolation between gate metal and the top source drain (See FIG. 25). If the first sacrificial dielectric layer 116 is not recessed below the top surface of the semiconductor fins 108, a later formed gate metal will touch the source drain epitaxy and create a short.

As such, controlling the depth of the first sacrificial dielectric layer 116 below the tops of the semiconductor fins 108 will allow for accurate top junction definition.

Figure 9:
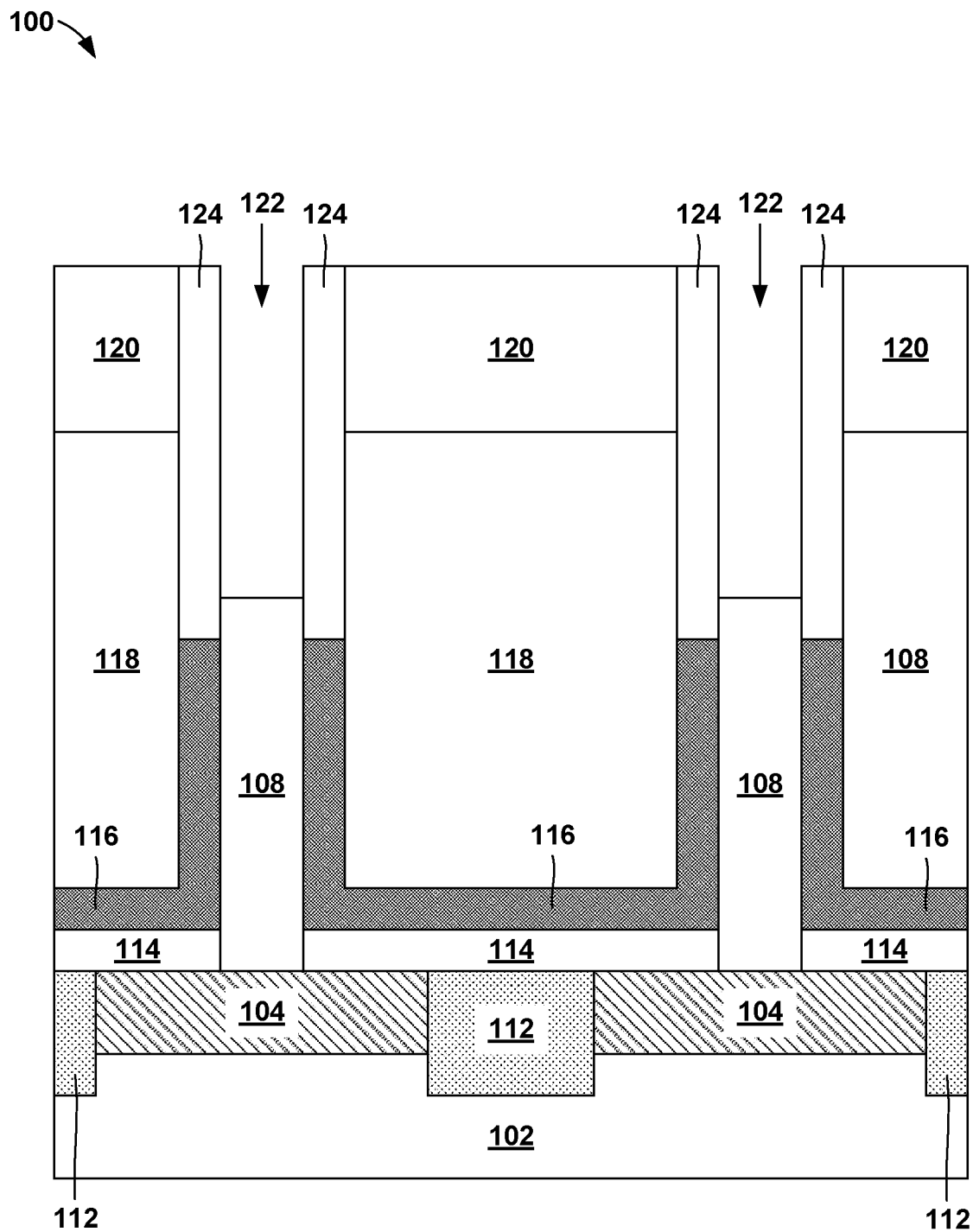
FIG. 9 is a cross-sectional view of a semiconductor structure after forming inner spacers according to an exemplary embodiment.

Referring now to FIG. 9, the structure 100 is shown after forming inner spacers 124 along exposed vertical sidewalls within the opening 122 in accordance with an embodiment of the present invention. More specifically, the inner spacers 124 may be formed along the vertical sidewalls of the sacrificial gate layer 118, the second sacrificial dielectric layer 120, and the semiconductor fins 108 exposed within the opening 122. A lower portion of the inner spacers 124 will fill the void between the sacrificial gate layer 118 and the semiconductor fins 108 created by the previous removal of the top portions of the first sacrificial dielectric layer 116.

The inner spacers 124 may be formed using a deposition technique followed by a spacer etch (anisotropic etch). For example, techniques for depositing the inner spacers 124 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for etching the inner spacers 124 include dry etching techniques, such as, for example, reactive ion etching, ion beam etching, plasma etching or laser ablation.

Figure 15:
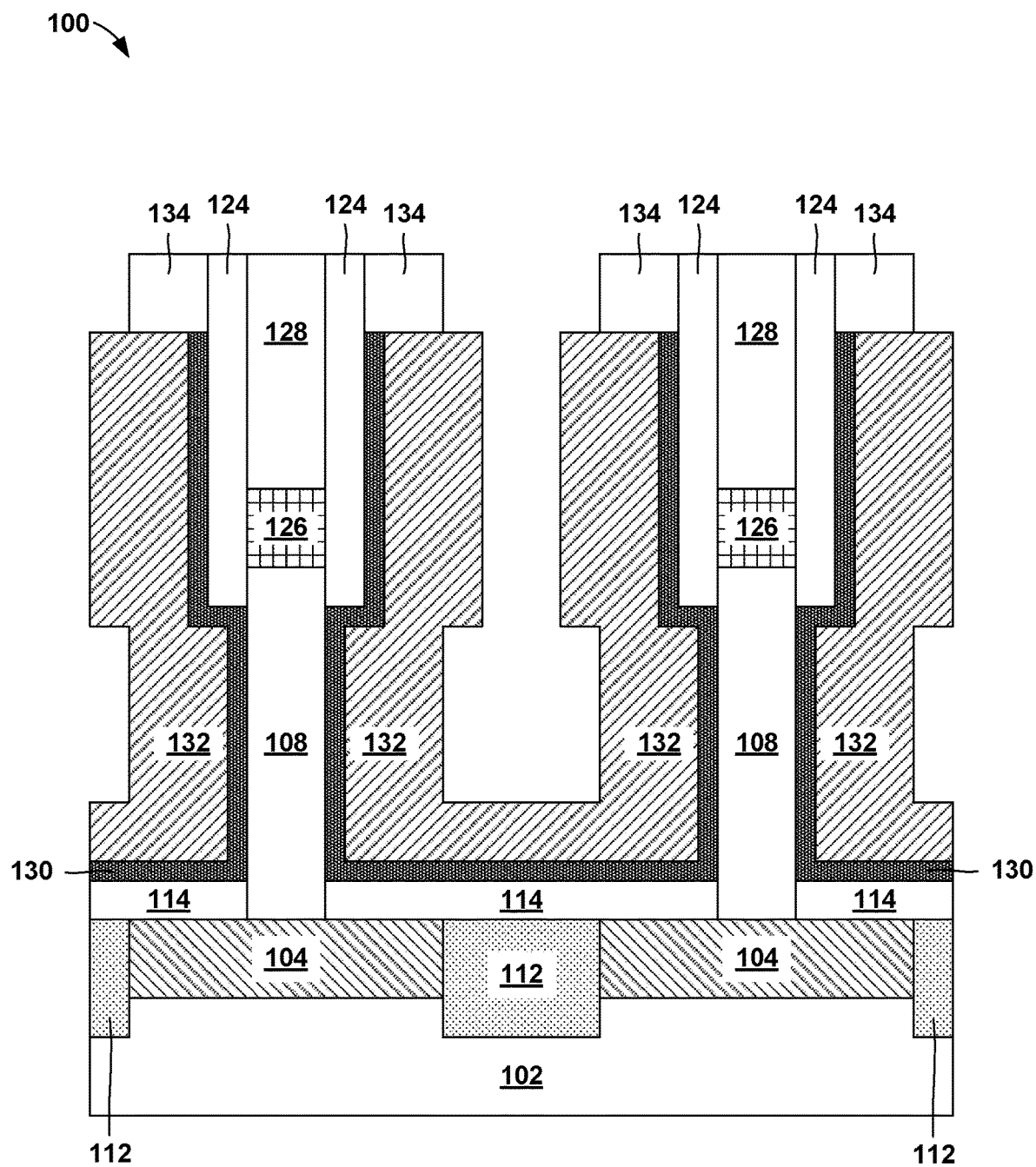
FIG. 15 is a cross-sectional view of a semiconductor structure after recessing the metal gate and forming top spacers according to an exemplary embodiment.

The inner spacers 124 are composed of any dielectric material that is different, in terms of composition and etch rate, than the dielectric material of the second sacrificial dielectric layer 120. Suitable dielectric materials include, but are not limited to, oxides such as silicon oxide ($SiO_x$), nitrides such as silicon nitride ($Si_xN_y$), and/or low-κ materials such as SiCOH or SiBCN. In an example, both the inner spacers 124 and the bottom spacers 114 are silicon nitride ($Si_xN_y$), while first sacrificial dielectric layer 116 is an oxide, for example silicon oxide ($SiO_x$). As such, the first sacrificial dielectric layer 116 can be subsequently removed or etched selective to the inner spacers 124 (FIG. 15).

Figure 10:
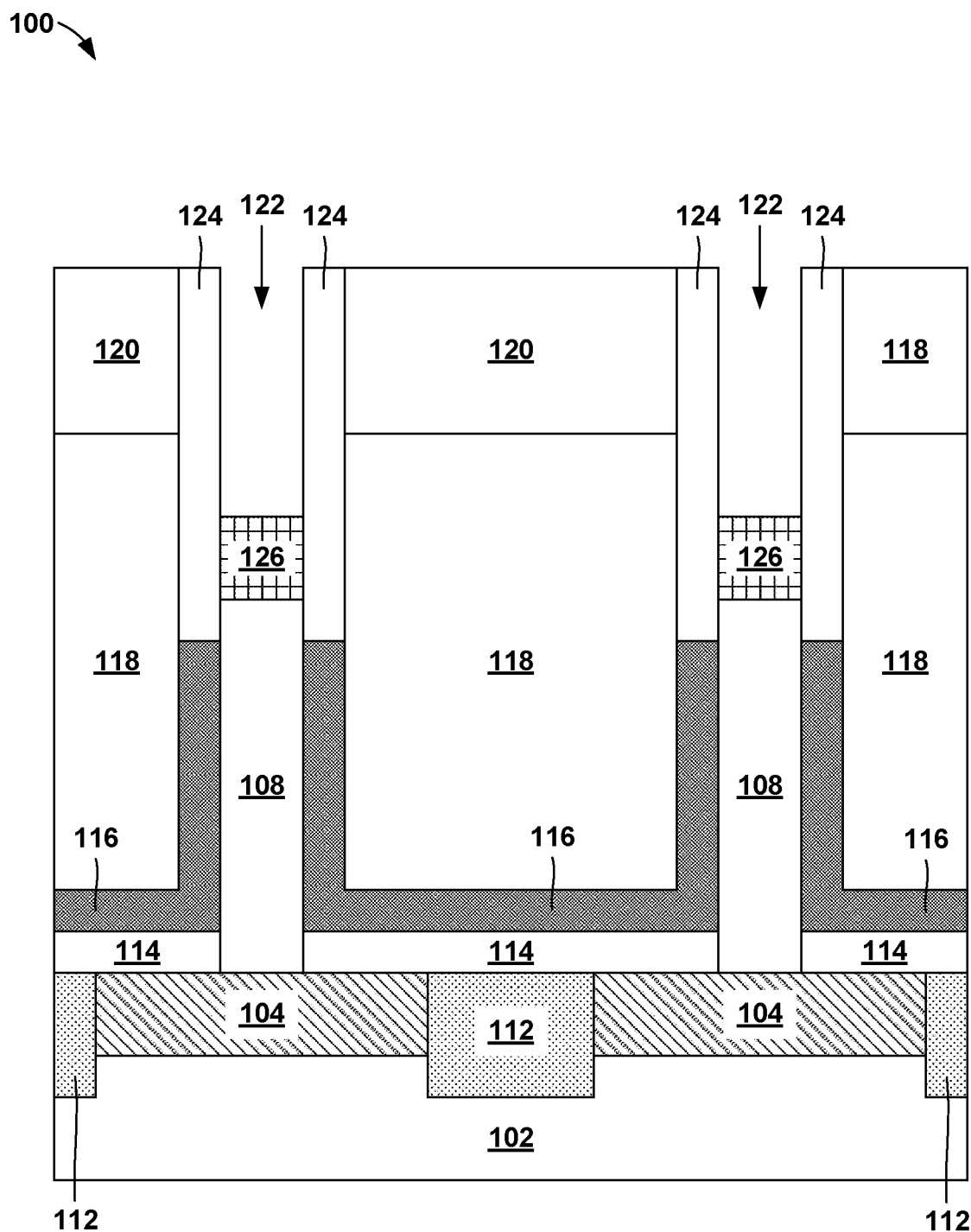
FIG. 10 is a cross-sectional view of a semiconductor structure after forming first top epitaxy regions according to an exemplary embodiment.

Referring now to FIG. 10, the structure 100 is shown after forming first top epitaxy regions 126 in accordance with an embodiment of the present invention. The first top epitaxy 126 is formed directly on top of the semiconductor fins 108 exposed at a bottom of the opening 122, as illustrated.

The first top epitaxy 126 can be epitaxially grown using conventional techniques. The first top epitaxy 126 may contain a dopant such as boron, phosphorus, or arsenic as desired. The dopant concentration in the first top epitaxy 126 should be sufficient to create the desired dopant transfer to the semiconductor fins 108 under reasonable time and temperature conditions. Preferably, the first top epitaxy 126 has a dopant concentration of at least about $1 \times 10^{21}$ atoms/cm$^3$, more preferably at least about $2 \times 10^{21}$ atoms/cm$^3$, most preferably about $3 \times 10^{21}$-$6 \times 10^{21}$ atoms/cm$^3$. Additionally, the thickness of the first top epitaxy 126 should also be sufficient to provide the necessary dopant concentration in the semiconductor fin 108 taking into account the dopant concentration in the first top epitaxy 126 and the desired dopant profile in the semiconductor fin 108. In an embodiment, the thickness of the first top epitaxy 126 can range from approximately 5 nm to approximately 20 nm in order to achieve the necessary dopant concentration. Other thicknesses that are lesser than 5 nm and greater than 20 nm can also be employed as the thickness of the first top epitaxy 126.

Like the bottom source drain regions 104, doping for the first top epitaxy 126 can be performed in-situ, and the composition of the first top epitaxy 126 and the dopants can vary depending on the type of vertical transistor being formed. By way of example only, for a p-FET, the first top epitaxy 126 can include boron-doped SiGe, whereas for an n-FET, the first top epitaxy 126 can include phosphorous-doped Si:C. In the present application, the first top epitaxy 126 will have a relatively low volume, but a relatively high dopant concentration.

Figure 11:
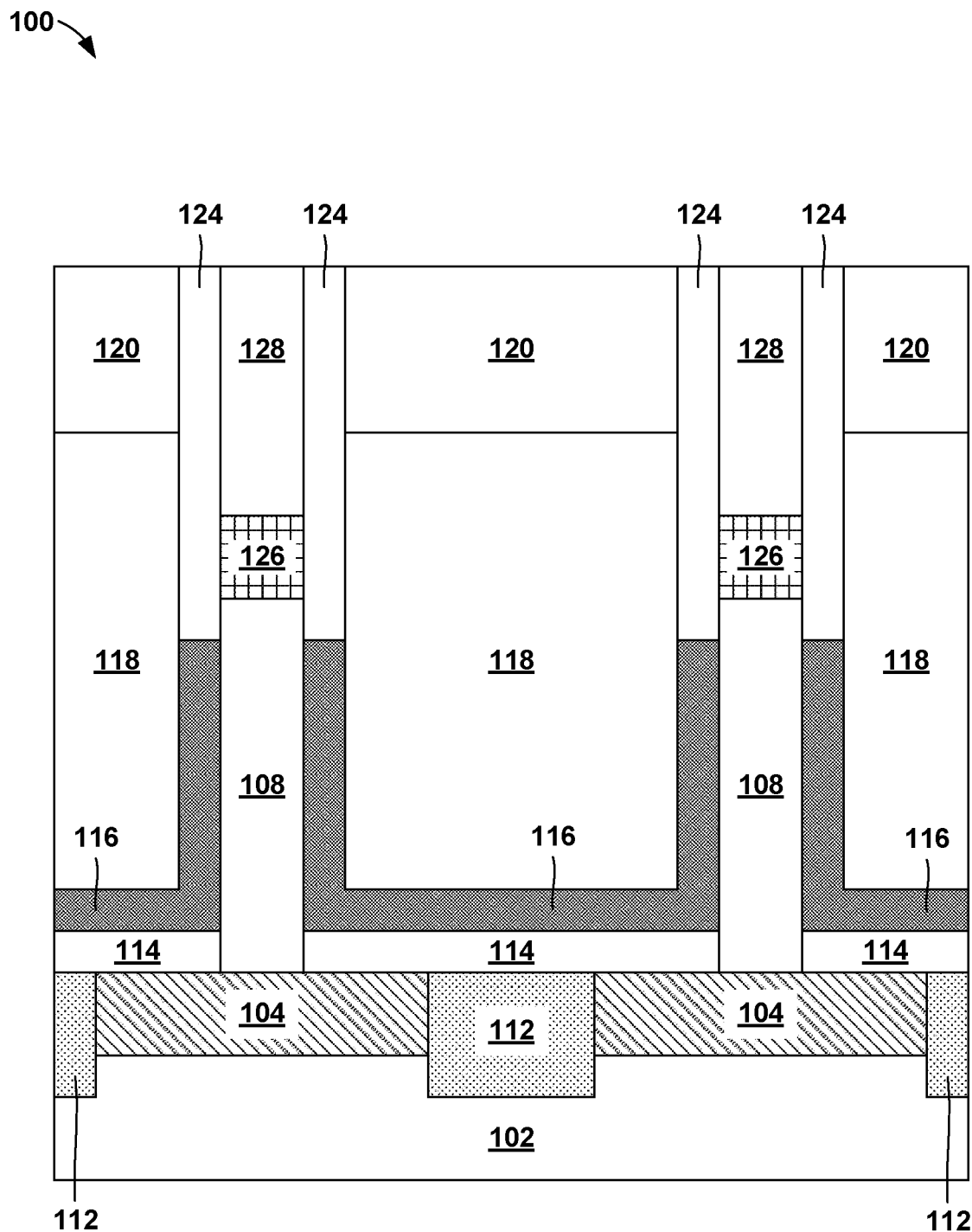
FIG. 11 is a cross-sectional view of a semiconductor structure after forming a dielectric cap according to an exemplary embodiment.

Referring now to FIG. 11, the structure 100 is shown after forming a dielectric cap 128 in accordance with an embodiment of the present invention. More specifically, the dielectric cap 128 may be formed within and substantially fill the opening 122. The dielectric cap 128 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

The dielectric cap 128 is composed of any dielectric material that is different, in terms of composition and etch rate, than the dielectric materials of the first sacrificial dielectric layer 116 and the second sacrificial dielectric layer 120. Suitable dielectric materials include, but are not limited to, oxides such as silicon oxide ($SiO_x$), nitrides such as silicon nitride ($Si_xN_y$), and/or low-κ materials such as SiCOH or SiBCN. In an example, both the inner spacers 124 and the dielectric cap 128 are silicon nitride ($Si_xN_y$), while first sacrificial dielectric layer 116 is an oxide, for example silicon oxide ($SiO_x$). As such, the second sacrificial dielectric layer 120 and the first sacrificial dielectric layer 116 can be subsequently removed or etched selective to the dielectric cap 128 (FIG. 15).

After deposition, a planarization technique such as, for example, chemical mechanical planarization (CMP) and/or grinding is applied. The planarization technique removes excess material of the dielectric cap 128 that extends above the inner spacers 124. After polishing an upper surface of the dielectric cap 128 is flush, or substantially flush, with an upper surface of the inner spacers 124.

After the first top epitaxy 126 is grown and the opening 122 is filled with the dielectric cap 128, an anneal is performed to diffuse the dopants from the first top epitaxy 126 into the semiconductor fin 108, or top of the channel, to form the junction. In an embodiment, the annealing technique may include subjecting the structure 100 to an elevated temperature, ranging from approximately 800° C. to approximately 1250° C., for approximately 1 ms to approximately 500 ms. In another embodiment, a high-temperature rapid thermal anneal (RTA) technique may be used. Typically, high temperatures cannot be used at this stage of fabrication due to risk of damaging a gate meal or work function metal; however, in the present case the gate metal or work function metal has not yet been fabricated thus allowing the use of a high temperature junction anneal.

Figure 12:
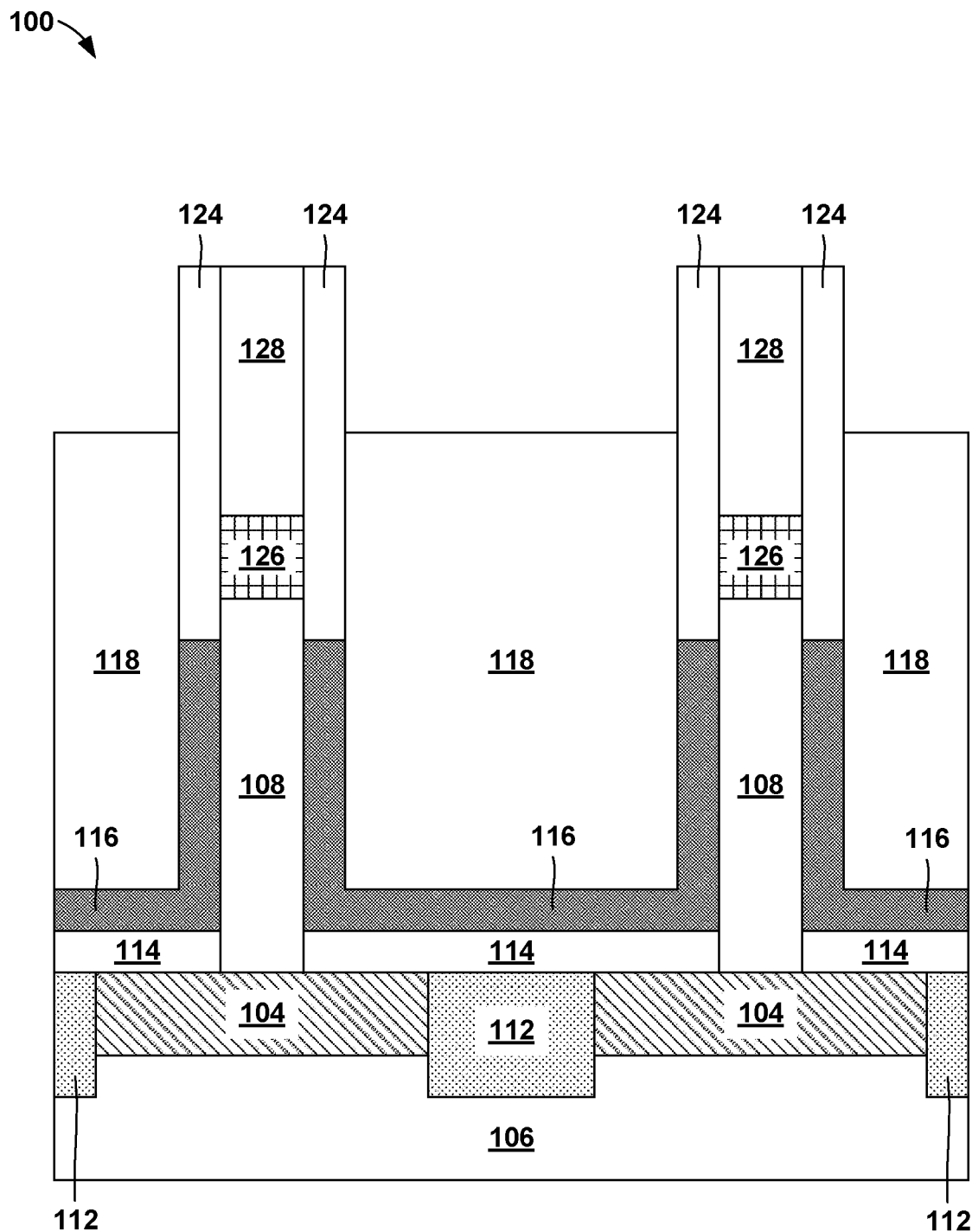
FIG. 12 is a cross-sectional view of a semiconductor structure after removing the second sacrificial dielectric layer according to an exemplary embodiment.

Referring now to FIG. 12, the structure 100 is shown after removing the second sacrificial dielectric layer 120 in accordance with an embodiment of the present invention. The second sacrificial dielectric layer 120 is removed selective to the dielectric cap 128, the inner spacers 124, and the sacrificial gate layer 118. The removal of second sacrificial dielectric layer 120 may be performed using at least one wet etching technique. When the first sacrificial dielectric layer 116 is composed of silicon oxide ($SiO_x$), a hydrofluoric acid or a buffered oxide etch (as defined above) can be used. After performing the etch, upper surfaces of the bottom spacers 114 and vertical sidewalls of the semiconductor fins 108 are exposed.

Figure 13:
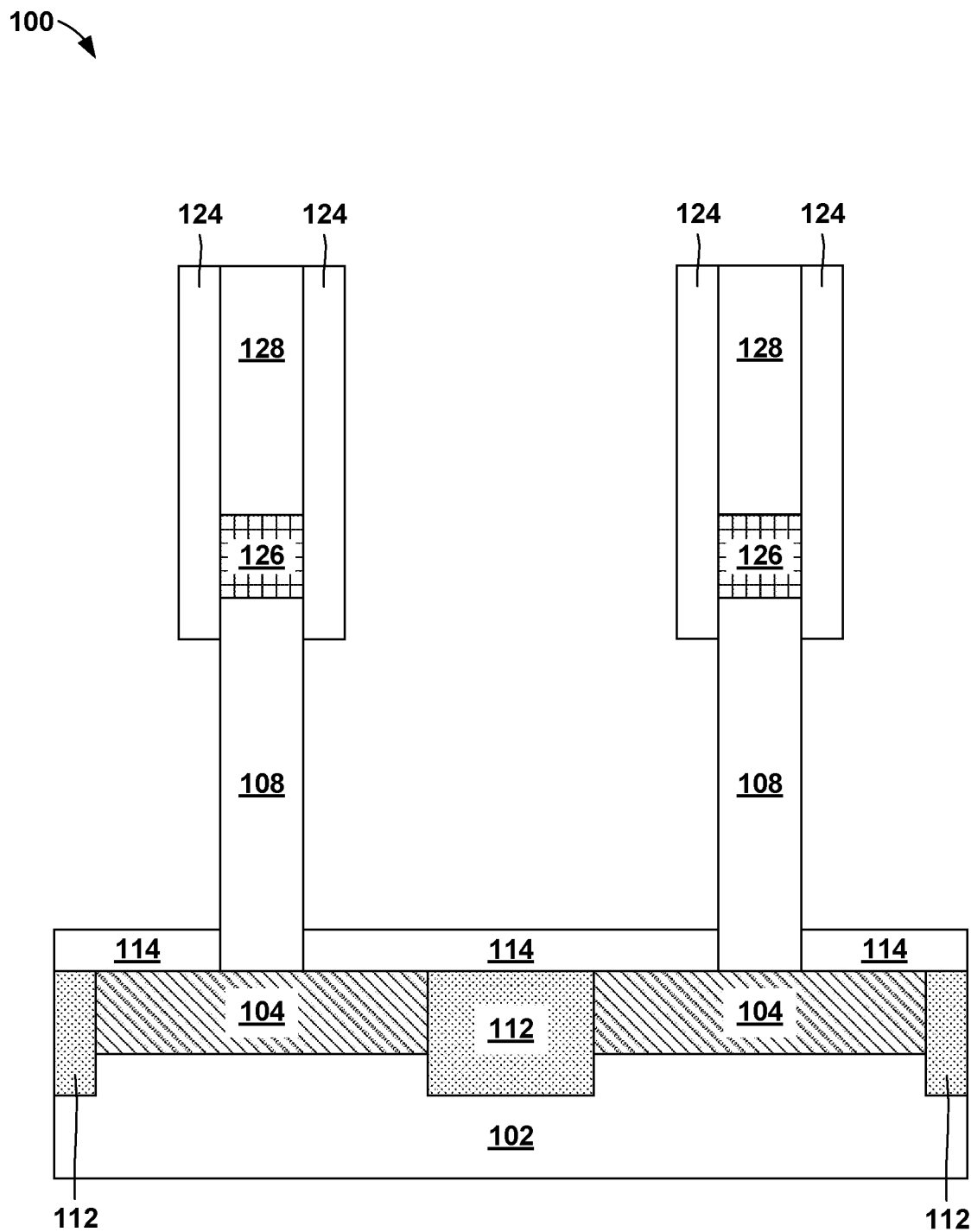
FIG. 13 is a cross-sectional view of a semiconductor structure after removing the sacrificial gate layer and the first sacrificial dielectric layer according to an exemplary embodiment.

Referring now to FIG. 13, the structure 100 is shown after removing the sacrificial gate layer 118 and the first sacrificial dielectric layer 116 in accordance with an embodiment of the present invention. First, remaining portions of the sacrificial gate layer 118 are removed selective to the dielectric cap 128, the inner spacers 124, and the first sacrificial dielectric layer 116. The removal of the sacrificial gate layer 118 may be performed using at least one anisotropic etching technique. After performing the etch, upper surfaces of the first sacrificial dielectric layer 116 are exposed.

Next, remaining portions of the first sacrificial dielectric layer 116 are removed selective to the dielectric cap 128, the inner spacers 124, and the bottom spacer layer 114. The removal of first sacrificial dielectric layer 116 may be performed using at least one wet etching technique. When the first sacrificial dielectric layer 116 is composed of silicon dioxide, a hydrofluoric acid or a buffered oxide etch (as defined above) can be used. After performing the etch, upper surfaces of the bottom spacer layer 114 and vertical sidewalls of the semiconductor fins 108 are exposed.

Figure 14:
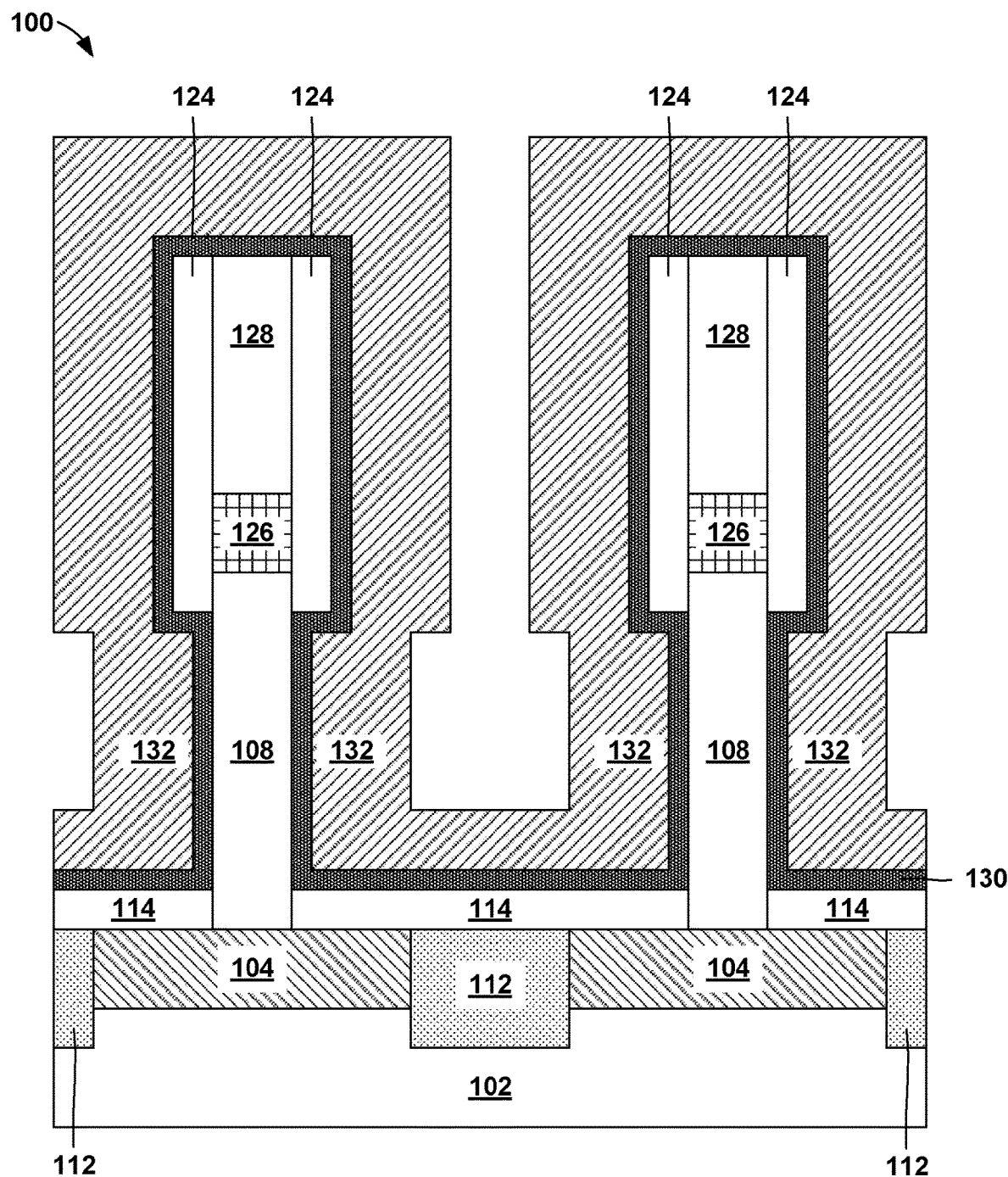
FIG. 14 is a cross-sectional view of a semiconductor structure after forming a gate dielectric and a metal gate according to an exemplary embodiment.

Referring now to FIG. 14, the structure 100 is shown after forming a gate dielectric 130 and a metal gate 132 in accordance with an embodiment of the present invention. In doing so, the gate dielectric 130 is in direct physical contact with exposed sidewall surfaces of the semiconductor fins 108, otherwise referred to as a channel.

The gate dielectric 130 is composed of a gate dielectric material. The gate dielectric 130 can be an oxide, nitride, and/or oxynitride. In an example, the gate dielectric 130 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric can be formed and used as the gate dielectric 130.

The gate dielectric 130 can be formed by any deposition technique including, for example, chemical vapor deposition (CVD), plasma enhanced chemical vapor deposition (PECVD), physical vapor deposition (PVD), sputtering, or atomic layer deposition. In some embodiments, the metal gate 132 is also a conformal layer, as descried and defined above. In an embodiment, the gate dielectric 130 can have a thickness in ranging from approximately 1 nm to approximately 10 nm. Other thicknesses that are lesser than, or greater than, the aforementioned thickness range can also be employed for the gate dielectric 130.

In an embodiment, the metal gate 132 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TiN, HfN, HfSi, or combinations thereof. The n-type work function metal can be formed using chemical vapor deposition atomic layer deposition, sputtering or plating.

In another embodiment, the metal gate 132 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof. In an embodiment, the p-type work function metal can be formed by, a physical vapor deposition method, such as sputtering, chemical vapor deposition or atomic layer deposition.

The metal gate 132 can be formed by any deposition technique including, for example, chemical vapor deposition (CVD), plasma enhanced chemical vapor deposition (PECVD), physical vapor deposition (PVD), sputtering, or atomic layer deposition. Like the gate dielectric 130, in some embodiments, the metal gate 132 is also a conformal layer. In an embodiment, the metal gate 132 can have a thickness in a ranging from approximately 1 nm to approximately 10 nm. Other thicknesses that are lesser than, or greater than, the aforementioned thickness range can also be employed for the used in providing the metal gate 132. It is critical to monitor and control forming of the metal gate 132 to prevent pinch off between adjacent devices.

Referring now to FIG. 15, the structure 100 is shown after recessing the metal gate 132 and forming top spacers 134 along exposed vertical surfaces of the inner spacers 124 in accordance with an embodiment of the present invention. First, a planarization layer (not shown) is blanket deposited on the structure 100. The planarization layer can be an organic planarization layer (OPL) or a layer of material that is capable of being planarized or etched by known techniques. In an embodiment, for example, the planarization layer can be an amorphous carbon layer able to withstand the high temperatures of subsequent processing steps. The planarization layer can preferably have a thickness sufficient to cover existing structures. For example, the planarization layer would typically be deposited such that is covers the metal gate 132. After deposition of the OPL, a dry etching technique is applied to recess the OPL and expose an uppermost surface of the metal gate 132.

Next, the metal gate 132 and the gate dielectric 130 are etched selective to the inner spacers 124 and the dielectric cap 128. More specifically, the metal gate 132 and the gate dielectric 130 are recessed below top surfaces of the inner spacers 124 and the dielectric cap 128. Recessing of the metal gate 132 and the gate dielectric 130 may be performed using at least one wet etching technique.

Finally, the top spacers 134 may be formed along the exposed vertical sidewalls of the inner spacers 124. The top spacers 134 may be formed using a deposition technique followed by a spacer etch (anisotropic etch). For example, techniques for depositing the top spacers 134 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for etching the top spacers 134 include dry etching techniques, such as, for example, reactive ion etching, ion beam etching, plasma etching or laser ablation.

Figure 18:
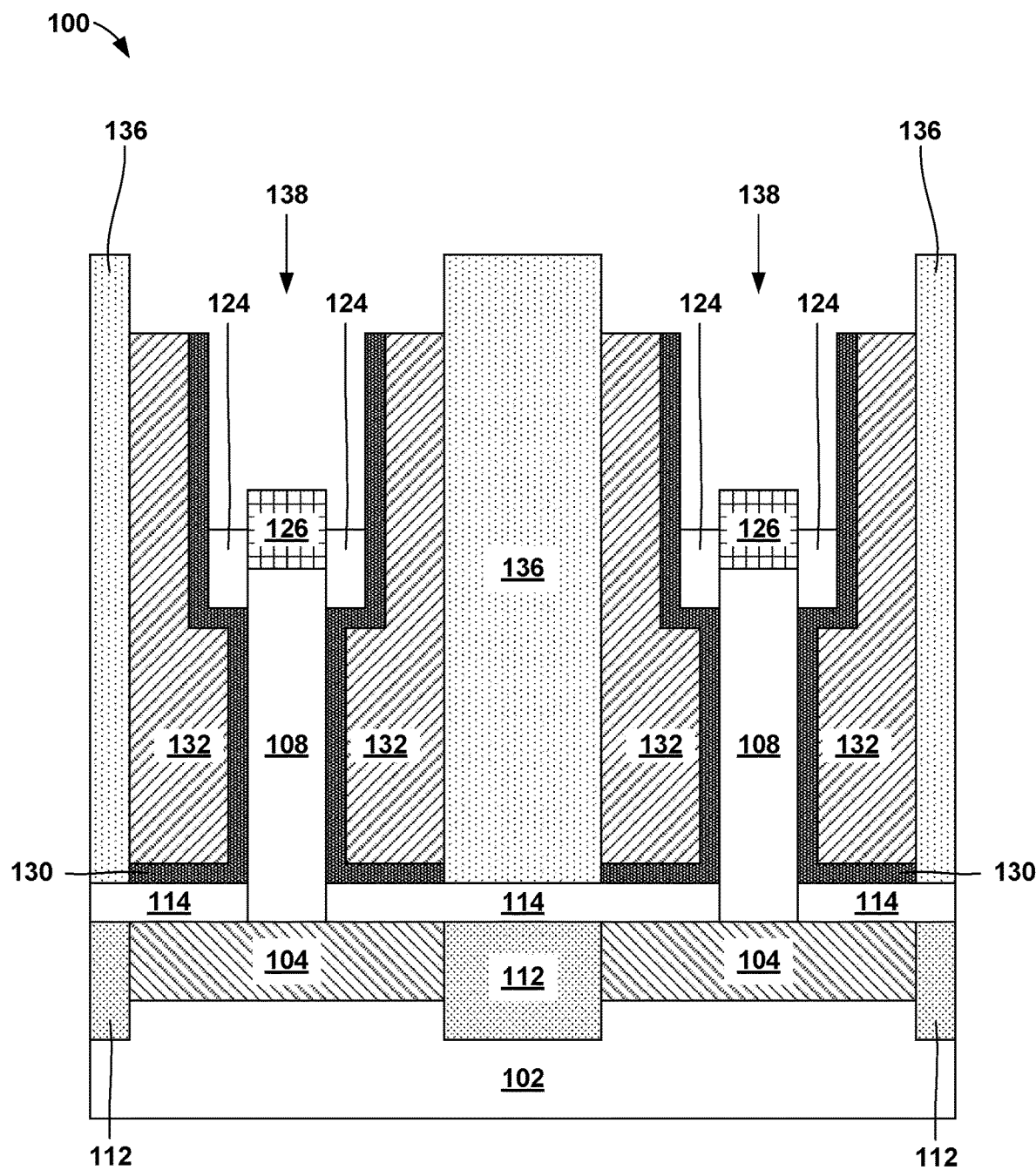
FIG. 18 is a cross-sectional view of a semiconductor structure after removing the top spacers and the dielectric cap, and recessing the inner spacers according to an exemplary embodiment.

The top spacers 134 are composed of any dielectric material that is similar, in terms of composition and etch rate, to the dielectric materials of the inner spacers 124 and the dielectric cap 128. Like above, suitable dielectric materials include, but are not limited to, oxides such as silicon oxide ($SiO_x$), nitrides such as silicon nitride ($Si_xN_y$), and/or low-κ materials such as SiCOH or SiBCN. In an example, the top spacers 134, the inner spacers 124 and the bottom spacers 114 are silicon nitride. As such, the metal gate 132 can be subsequently removed or etched selective to the top spacers 134, the inner spacers 124 and the bottom spacers 114 (FIG. 18). Finally, any planarization layer, for example the OPL, is removed by ashing.

Figure 16:
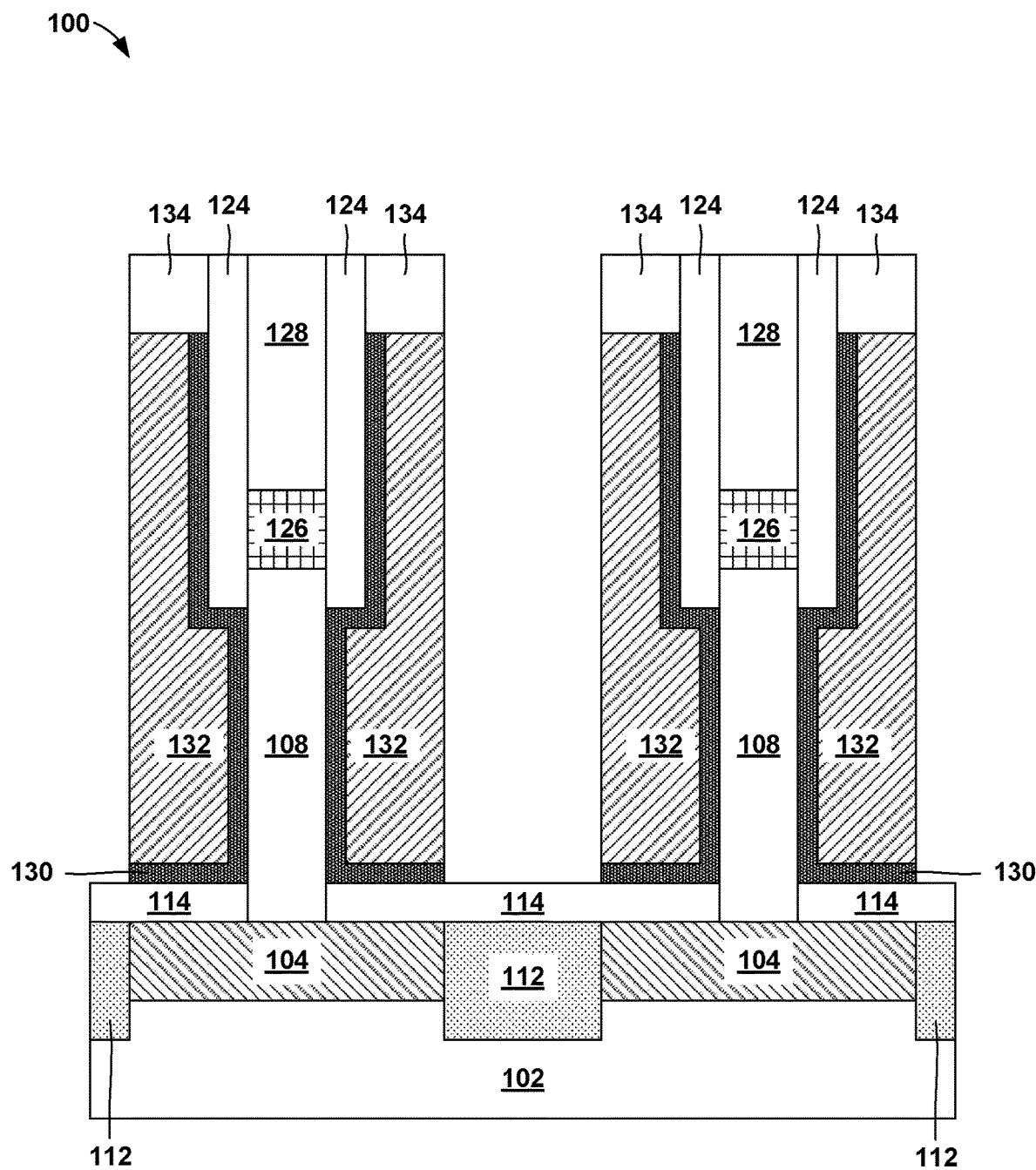
FIG. 16 is a cross-sectional view of a semiconductor structure after trimming the gate dielectric and the metal gate according to an exemplary embodiment.

Referring now to FIG. 16, the structure 100 is shown after self-aligned etching of the gate dielectric 130 and the metal gate 132 in accordance with an embodiment of the present invention. The gate dielectric 130, and the metal gate 132 are etched selective to the top spacers 134, the inner spacers 124, the dielectric cap 128, and the bottom spacer 114. The etching performed in this step of the present application uses the top spacers 134, the inner spacers 124 and the dielectric cap 128 as an etch mask, and stops on the bottom spacer 114. The etching may be performed using any etching technique suitable for etching the materials of the gate dielectric 130 and the metal gate 132. For example, etching the gate dielectric 130 and the metal gate 132 may include using an anisotropic dry etching technique (such as, for example, reactive ion etching, ion beam etching, plasma etching or laser ablation). After etching, the uppermost surface of the bottom spacer 114 is exposed.

Figure 17:
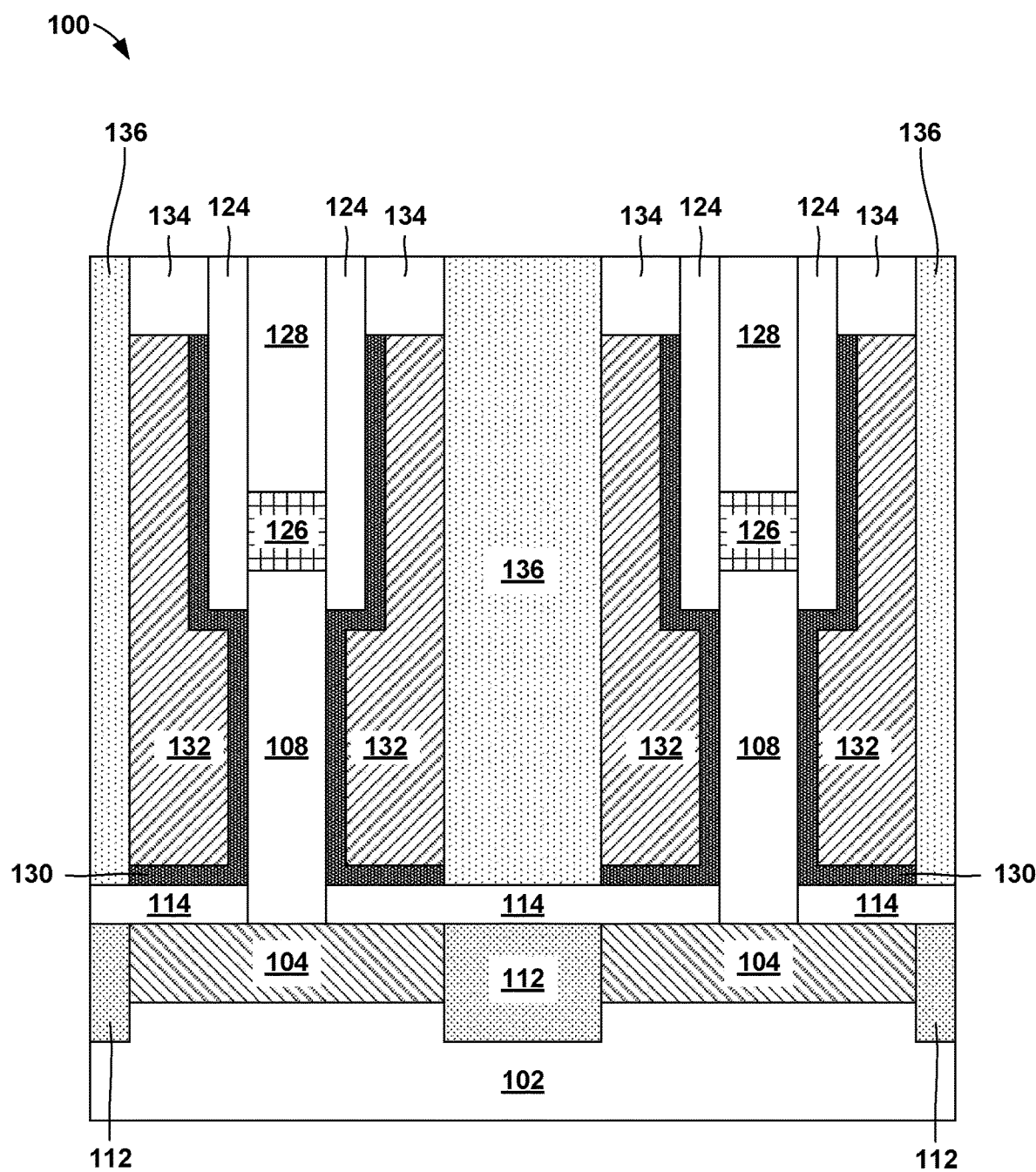
FIG. 17 is a cross-sectional view of a semiconductor structure after forming an interlevel dielectric layer according to an exemplary embodiment.

Referring now to FIG. 17, the structure 100 is shown after forming an interlevel dielectric layer 136 in accordance with an embodiment of the present invention. The interlevel dielectric layer 136 surrounds the structure shown in FIG. 18 and has a topmost surface that is flush, or substantially flush, with each of the top spacers 134, the inner spacers 124, and the dielectric cap 128. The interlevel dielectric layer 136 is composed of any dielectric material that is different, in terms of composition and etch rate, than the dielectric materials of either the top spacers 134, the inner spacers 124, and the dielectric cap 128.

The interlevel dielectric layer 136 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide. In another example, the interlevel dielectric layer 136 is silicon nitride ($Si_xN_y$), while the top spacers 134, the inner spacers 124, and the dielectric cap 128 are silicon oxide ($SiO_x$). In all cases, materials should be selected such that the top spacers 134, the inner spacers 124, and the dielectric cap 128 can be subsequently removed or etched selective to the interlevel dielectric layer 136. In yet another example, the interlevel dielectric layer 136 can be other dielectrics such as SiC or SiCO. In another example, the interlevel dielectric layer 136 can be a combination of several layers, such as a very thin layer of silicon nitride ($Si_xN_y$) followed by oxide overfill and CMP.

In an embodiment, the interlevel dielectric layer 136 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. After deposition, a planarization technique such as, for example, chemical mechanical planarization (CMP) and/or grinding is applied. The planarization technique removes excess material of the interlevel dielectric layer 136 and continues polishing until the uppermost surfaces of the top spacers 134, the inner spacers 124, and the dielectric cap 128 are exposed. After polishing the uppermost surfaces of the top spacers 134, the inner spacers 124, and the dielectric cap 128 are flush, or substantially flush, with an uppermost surface of the interlevel dielectric layer 136. In another embodiment, interlevel dielectric layer 136 may include a self-planarizing material such as a spin-on glass (SOG) or a spin-on low-κ dielectric material such as SiLK™. Doing so may avoid the need to perform a subsequent planarizing step.

Referring now to FIG. 18, the structure 100 is shown after removing the top spacers 134 and the dielectric cap 128, and recessing the inner spacers 124 in accordance with an embodiment of the present invention. More specifically, the top spacers 134 and the dielectric cap 128 are removed completely, and the inner spacers 124 are recessed such that top portions of the first top epitaxy 126 are exposed in an opening 138. The top spacers 134, the dielectric cap 128, and the inner spacers 124 are recessed or etched selective to the interlevel dielectric layer 136, the gate dielectric 130, the metal gate 132, and the first top epitaxy 126.

The etching may be performed using any etching technique suitable for etching the materials of the top spacers 134, the dielectric cap 128, and the inner spacers 124 selective to the interlevel dielectric layer 136, the gate dielectric 130, the metal gate 132, and the first top epitaxy 126. For example, etching the top spacers 134, the dielectric cap 128, and the inner spacers 124 may include using a dry etching technique (such as, for example, reactive ion etching, ion beam etching, plasma etching or laser ablation), and/or a wet chemical etching technique.

Figure 19:
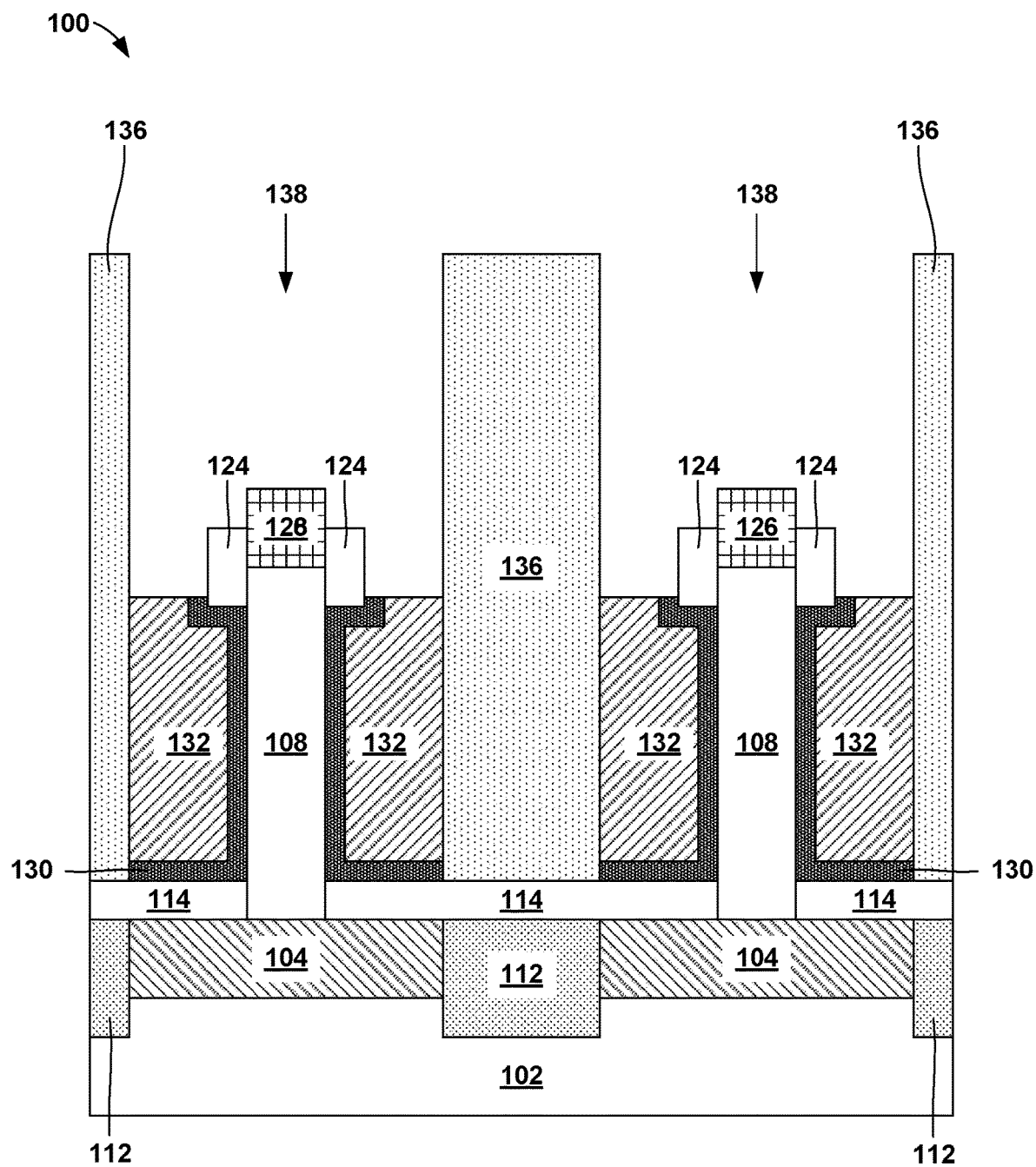
FIG. 19 is a cross-sectional view of a semiconductor structure after recessing the gate dielectric and the metal gate according to an exemplary embodiment.

Referring now to FIG. 19, the structure 100 is shown after recessing the gate dielectric 130 and the metal gate 132 in accordance with an embodiment of the present invention. The gate dielectric 130, and the metal gate 132 are etched selective to the interlevel dielectric layer 136 and remaining portions of the inner spacers 124. The etching performed in this step of the present application uses the interlevel dielectric layer 136 and remaining portions of the inner spacers 124 as an etch mask. Etching continues until uppermost surfaces of both the gate dielectric 130 and the metal gate 132 are recessed to a level above lowermost surfaces of the inner spacers 124, but below uppermost surfaces of the inner spacers 124. It is critical that the gate dielectric 130 and the metal gate 132 are not recessed below a bottom of the inner spacers 124, or else there is a risk of creating a short between the metal gate 132 and a subsequently formed top source drain region—which includes the first top epitaxy 126.

The etching may be performed using any etching technique suitable for etching the materials of the gate dielectric 130 and the metal gate 132 selective to the interlevel dielectric layer 136 and remaining portions of the inner spacers 124. For example, etching the gate dielectric 130 and the metal gate 132 may include using a dry etching technique (such as, for example, reactive ion etching, ion beam etching, plasma etching or laser ablation), and/or a wet chemical etching technique. As such, the gate dielectric 130 and the metal gate 132 have a signature notch or recess occupied by the remaining portions of the inner spacers 124.

Figure 20:
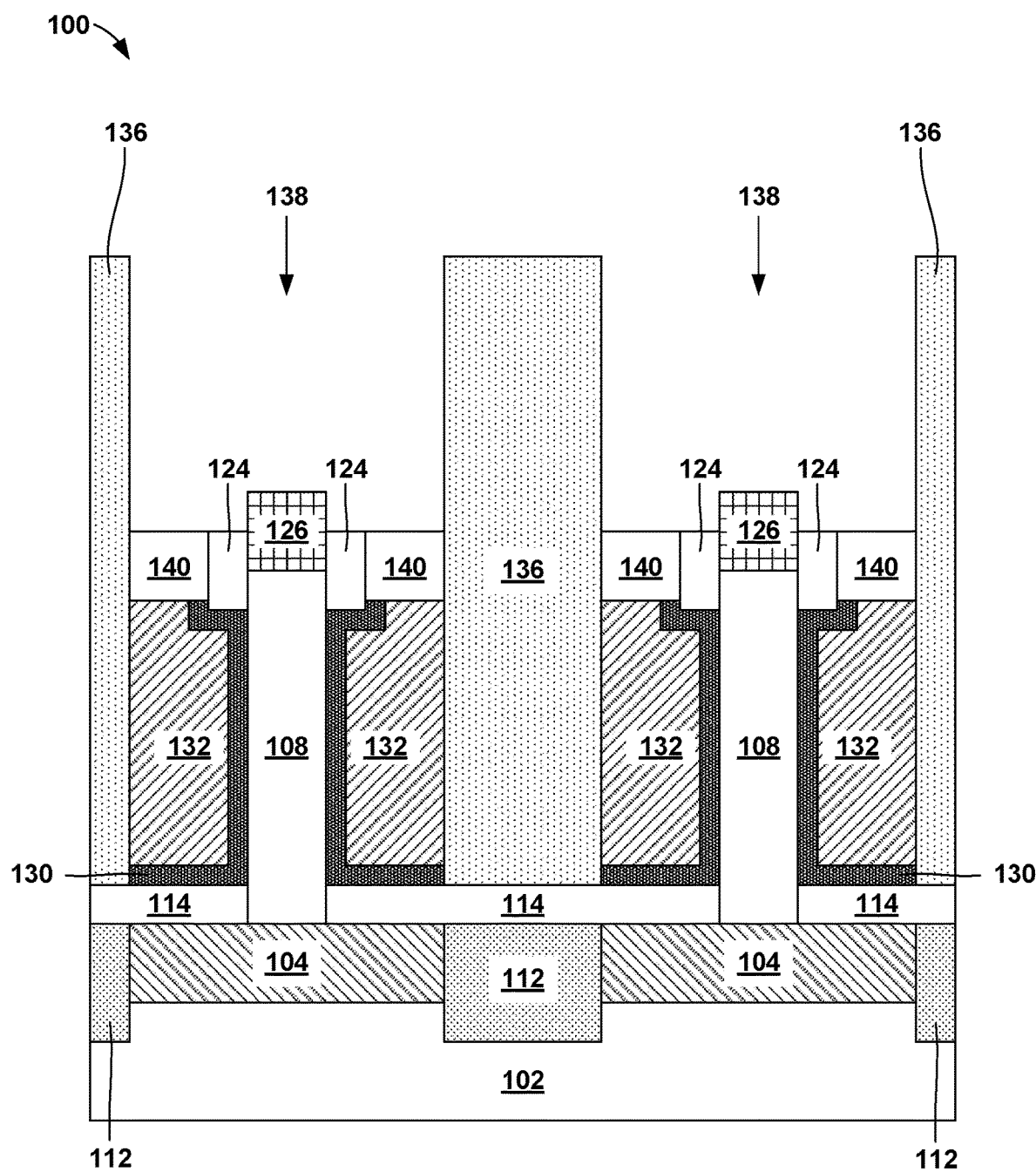
FIG. 20 is a cross-sectional view of a semiconductor structure after forming spacer extensions according to an exemplary embodiment.
Figure 21:
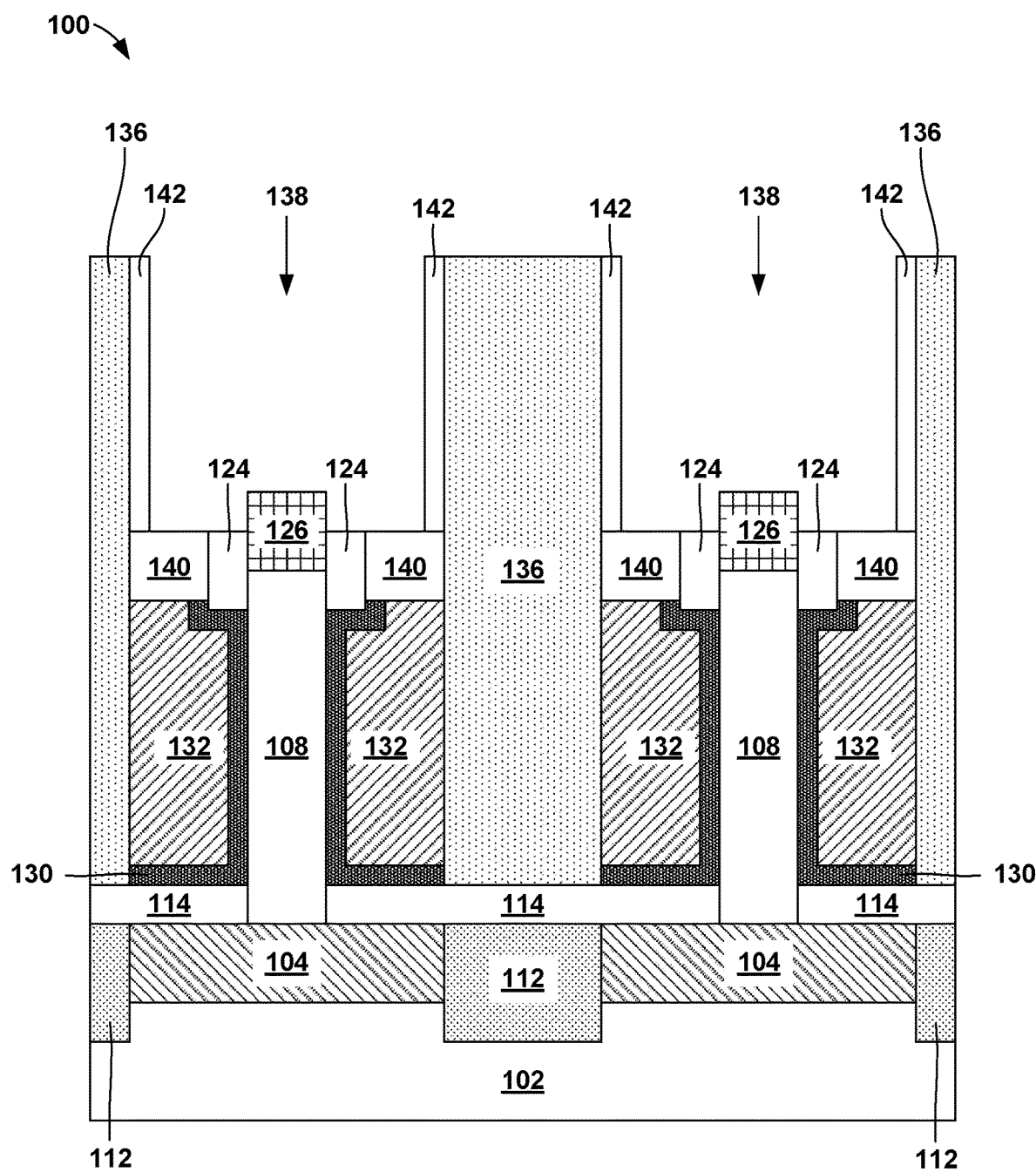
FIG. 21 is a cross-sectional view of a semiconductor structure after forming a protective sidewall liner according to an exemplary embodiment.

Referring now to FIG. 20, the structure 100 is shown after forming spacer extensions 140 in accordance with an embodiment of the present invention. The spacer extensions 140 are formed directly on the exposed uppermost surfaces of the gate dielectric 130 and the metal gate 132 and fill a space between the interlevel dielectric layer 136 and the inner spacers 124. Together, the inner spacers 124 and the spacer extensions 140, which may be collectively referred to as a dielectric spacer, electrically isolate the metal gate 132 from a subsequently formed top source drain region—which includes the first top epitaxy 126. The inner spacers 124 and the spacer extensions 140, together as the dielectric spacer, extend laterally from the semiconductor fins 108 and the first epitaxy region 126 to the interlevel dielectric layer 136

The spacer extensions 140 are composed of any dielectric material similar, in terms of composition and insulating properties, to the dielectric materials of the inner spacers 124. In an embodiment, and when the inner spacers 124 are composed of silicon oxide ($SiO_x$), the spacer extensions 140 are composed of a carbon compound such as, for example, silicon carbon compound. In another embodiment, and when the inner spacers 124 are composed of silicon oxide ($SiO_x$), the spacer extensions 140 are also composed of silicon oxide ($SiO_x$).

The spacer extensions 140 can be formed using a deposition technique followed by a recess etch. For example, techniques for depositing the spacer extensions 140 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for recessing (etching) the spacer extensions 140 include dry etching techniques, such as, for example, reactive ion etching, ion beam etching, plasma etching or laser ablation. In an embodiment, uppermost surfaces of the spacer extensions 140 may be flush, or substantially flush, with uppermost surfaces of the inner spacers 124. It should be noted that the overall height of the spacer extensions 140 may differ from the overall height of the inner spacers 124 as illustrated. The overall height of the spacer extensions 140 is controlled by recessing the gate dielectric 130 and the metal gate 132 (see FIG. 21). In at least one emebodiment, the Referring now to FIG. 21, the structure 100 is shown after forming a protective sidewall liner 142 in accordance with an embodiment of the present invention. More specifically, the protective sidewall liner 142 may be formed along the vertical sidewalls of the interlevel dielectric layer 136 within the opening 138.

The protective sidewall liner 142 may be formed using a deposition technique followed by a spacer etch (anisotropic etch). For example, techniques for depositing the protective sidewall liner 142 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for etching the protective sidewall liner 142 include dry etching techniques, such as, for example, reactive ion etching, ion beam etching, plasma etching or laser ablation.

The protective sidewall liner 142 is composed of any material having sufficient properties to protect a subsequently formed top source drain region—which includes the first top epitaxy 126, from electromigration failures caused by conductive material of the top source drain from migrating into the interlevel dielectric layer 138. Suitable materials include, but are not limited to, tantalum nitride and tantalum (TaN/Ta), titanium, titanium nitride, cobalt, ruthenium, and manganese.

Figure 22:
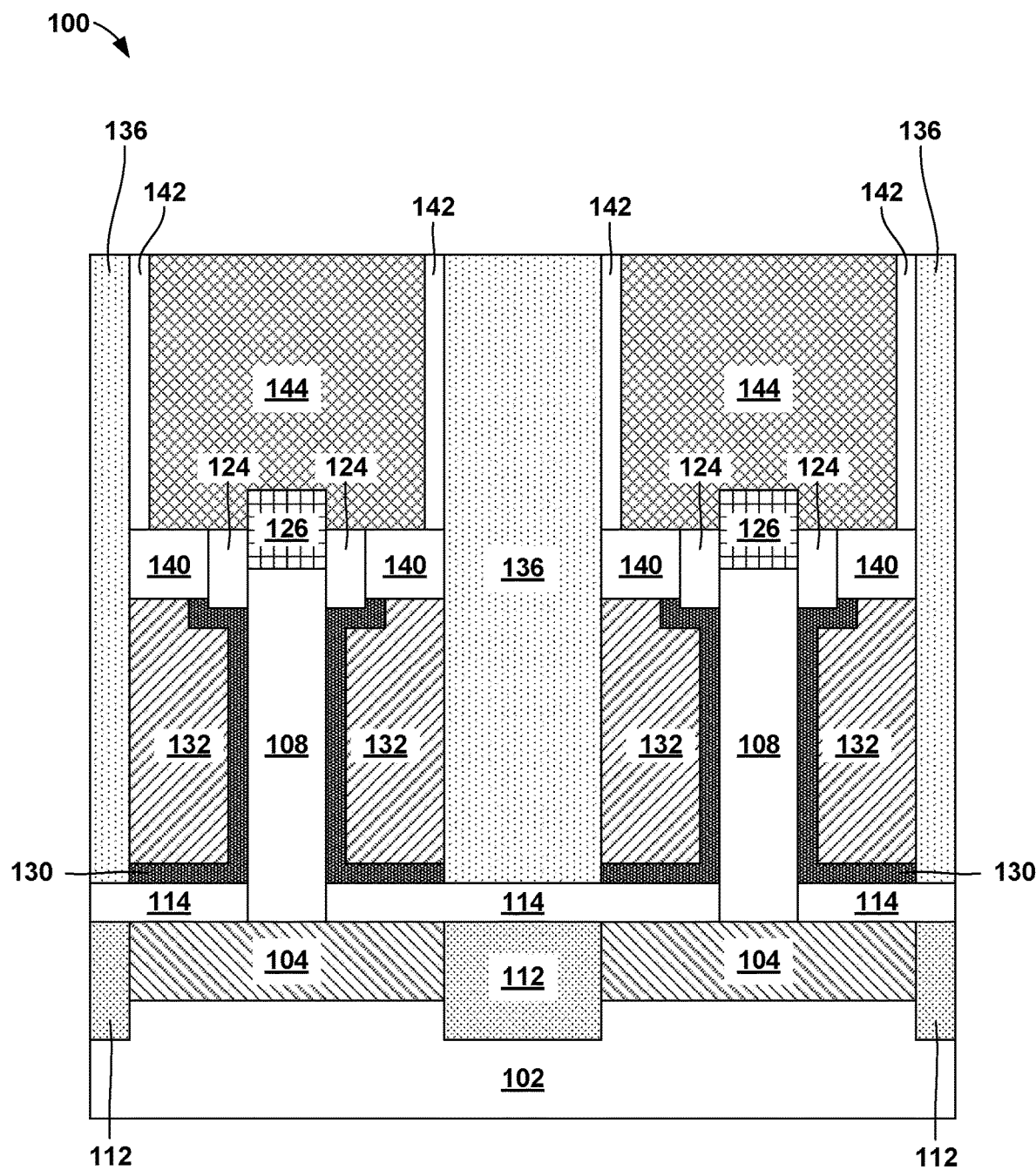
FIG. 22 is a cross-sectional view of a semiconductor structure after forming second top epitaxy regions according to an exemplary embodiment.

Referring now to FIG. 22, the structure 100 is shown after forming second top epitaxy regions 144 in accordance with an embodiment of the present invention. The second top epitaxy 144 is formed directly on top of the first top epitaxy 126, the inner spacers 124, and the spacer extensions 140 within the opening 138. As such, the protective sidewall liner 142 separates the second top epitaxy 144 from contacting the interlevel dielectric layer 136.

The second top epitaxy 144 can be epitaxially grown using conventional techniques. Like the first top epitaxy 126 described above, the second top epitaxy 144 may contain a dopant such as boron, phosphorus, or arsenic as desired. The dopant concentration in the second top epitaxy 144 should be sufficient to produce a epitaxial region having high electrical conductivity. Preferably, the second top epitaxy 144 has a dopant concentration of at least about $4 \times 10^{20}$ atoms/cm$^3$, more preferably at least about $8 \times 10^{20}$ atoms/cm$^3$, most preferably about $1 \times 10^{21}$-$2 \times 10^{21}$ atoms/cm$^3$. Additionally, the thickness of the second top epitaxy 144 should be sufficient to fill the opening 138.

Like the bottom source drain regions 104 and the first top epitaxy 126, doping for the second top epitaxy 144 can be performed in-situ, and the composition of the second top epitaxy 144 and the dopants can vary depending on the type of vertical transistor being formed. By way of example only, for a p-FET, the second top epitaxy 144 can include boron-doped SiGe, whereas for an n-FET, the second top epitaxy 144 can include phosphorous-doped Si:C. In the present application the second top epitaxy 144 will have a relatively large volume, and a relatively high dopant concentration. However, the dopant concentration of the second top epitaxy 144 will be less than the dopant concentration of the first top epitaxy 126.

After forming, unlike the first top epitaxy 126, the second top epitaxy 144 does not undergo a high temperature anneal in order to preserve the integrity of the metal gate 132. Additionally, the top junction was previously formed during forming and anneal of the first top epitaxy 126.

Figure 23:
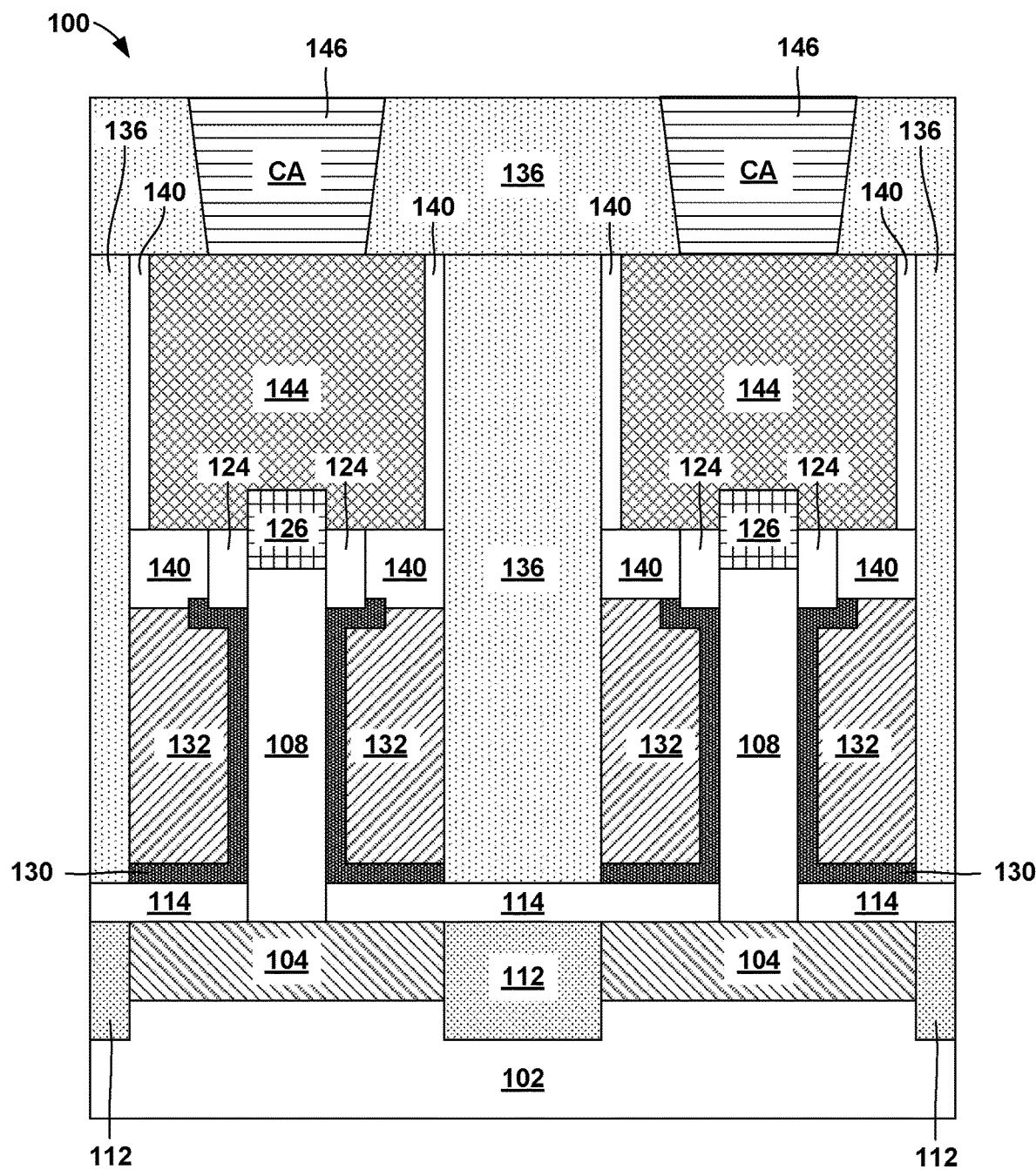
FIG. 23 is a cross-sectional view of a semiconductor structure after forming contact structures according to an exemplary embodiment.

Referring now to FIG. 23, the structure 100 is shown after forming contact structures 146 in accordance with an embodiment of the present invention. First, more interlevel dielectric layer 136 is deposited on top of the structure 100. Next, contact trenches are formed in the interlevel dielectric layer 136. Finally, the contact trenches are filled with a conductive material to form the contact structures 146. The contact structures 146 can be formed by deposition of a conductive material. The contact structures 146 may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the contact structures 146.

After deposition, a planarization technique such as, for example, chemical mechanical planarization (CMP) and/or grinding is applied. The planarization technique removes excess conductive material of the contact structures 146. After polishing an upper surface of the contact structures 146 is flush, or substantially flush, with an upper surface of the additional interlevel dielectric layer 136.

As illustrated in FIG. 23, the vertical transistor device represented by the structure 100 in this example has some distinctive notable features. For instance, the structure 100 includes a two-stage top source drain region. More specifically, both the first top epitaxy 126 and the second top epitaxy 144 make-up the two-stage top source drain region. The two-stage top source drain region is particularly beneficial because the first stage is fabricated using a high dopant concentration and a high temperature anneal to maximize dopant diffusion at the top junction. As discussed above, this is made possible because the metal gate 132 is not yet formed. The second stage, for example the second top epitaxy 144 is then subsequently formed with larger dimensions suitable landing a contact. It may be noted that not all advantages of the present invention are included above.

Additionally, by forming the top source drain regions in two stages, we overcome the space issue and pinch off during gate last formation of the gate dielectric 130 and the metal gate 132. As discussed above with respect to the formation of the first top epitaxy 126, the first step includes a very high doped, small volume epitaxy or even pure dopant deposited onto the exposed fin end. Since the first top epitaxy 126 is formed prior to the gate metal 132, the junction anneal can be performed at any desired temperature. Doing so further allows fine tuning of the top and bottom epitaxy dopant concentrations and expected diffusion, thereby making a symmetrical device in easier to form. After gate last formation of the gate dielectric 130 and metal gate 132 a second, lower doped, larger epitaxy is formed, as described in detail above with respect to the second top epitaxy 144. This second top epitaxy process needs to be low temperature, since the metal gate 136 is now in place.

Figure 24:
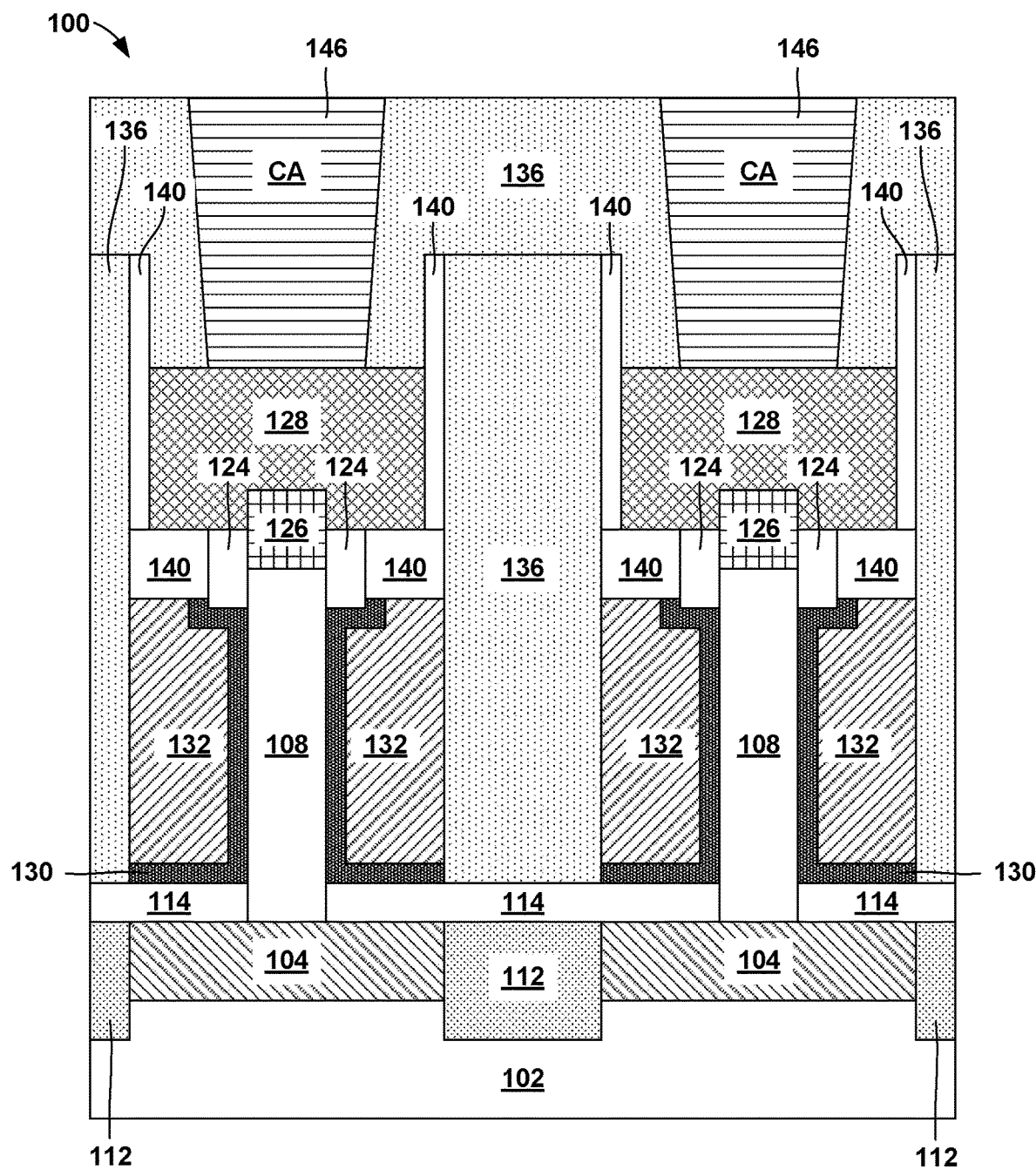
FIG. 24 is a cross-sectional view of a semiconductor structure according to an exemplary embodiment.

Referring now to FIG. 24, in an alternative embodiment, the second top epitaxy 144 may be recessed after formation, thereby decreasing its thickness.

Figure 25:
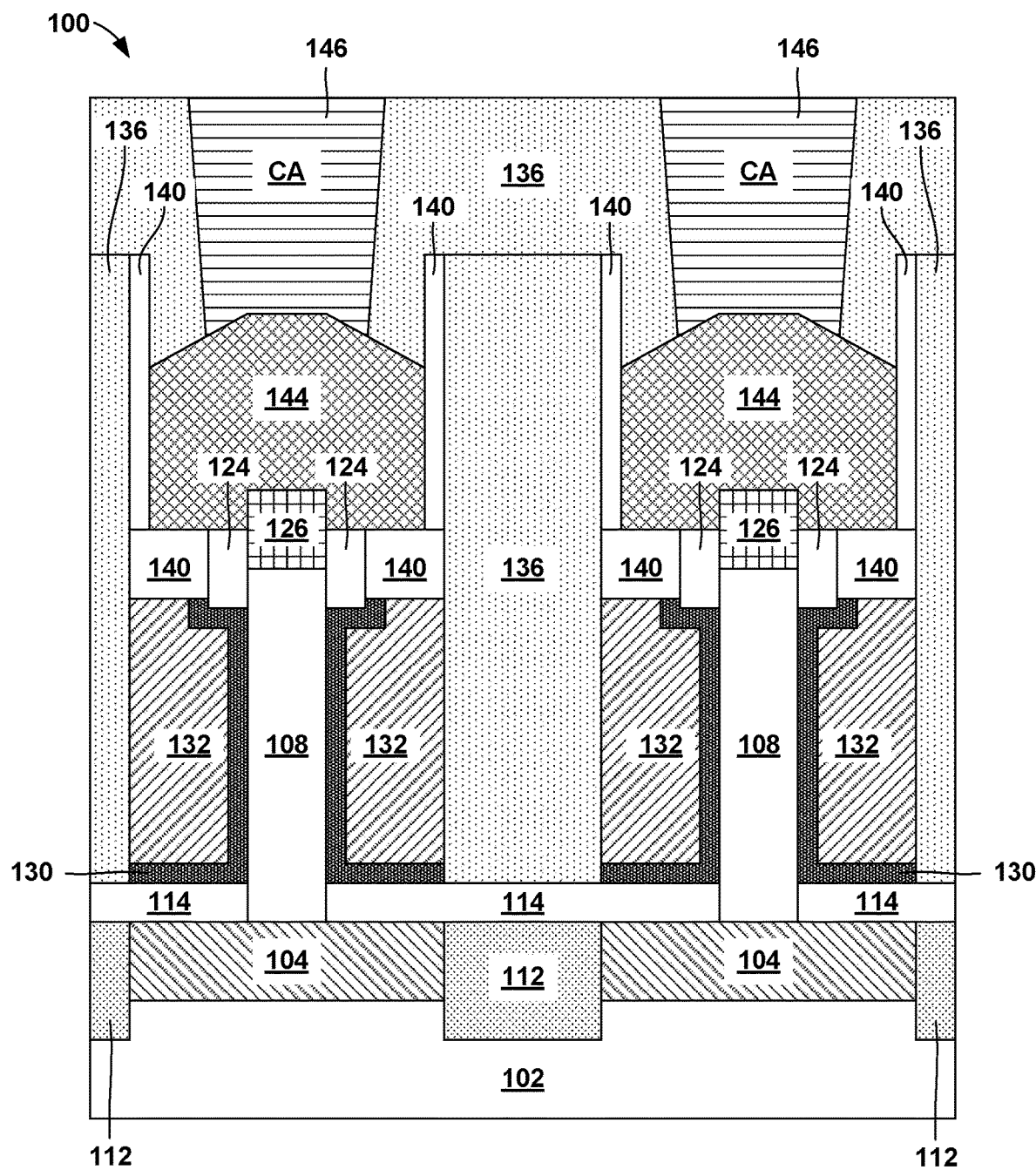
FIG. 25 is a cross-sectional view of a semiconductor structure according to an exemplary embodiment.

Referring now to FIG. 25, in yet another embodiment, the second top epitaxy 144 can be grown such that the top of the second top epitaxy 144 may have faceted surfaces allowing for increase contact area with a subsequently formed contact.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    a bottom source drain region arranged on a substrate;
    a semiconductor channel region extending vertically upwards from a top surface of the bottom source drain region;
    a metal gate disposed on and around the semiconductor channel region; and
    a top source drain region above the semiconductor channel region and comprising a first doped epitaxy region and a second doped epitaxy region, wherein the first doped epitaxy region has a dopant concentration of at least about $5 \times 10^{21}$ atoms/cm$^3$, and the second doped epitaxy region has a dopant concentration of at least about $4 \times 10^{20}$ atoms/cm$^3$.

2. The semiconductor structure according to claim 1, further comprising:
    a bottom spacer separating the bottom source drain region from the metal gate.

3. The semiconductor structure according to claim 1, wherein a width of the first doped epitaxy region of the top source drain region is substantially equal to a width of the semiconductor channel region, and wherein a width of the second doped epitaxy region of the top source drain region is larger than the width of the semiconductor channel region.

4. The semiconductor structure according to claim 1, further comprising:
    sidewall spacers disposed along vertical sidewalls of the second doped epitaxy region and separating the second epitaxy doped region from an interlevel dielectric layer.

5. The semiconductor structure according to claim 1, further comprising:
    a contact on the second doped epitaxy region.

6. A semiconductor structure comprising:
    a bottom source drain region arranged on a substrate;
    a semiconductor channel region extending vertically upwards from a top surface of the bottom source drain region;
    a metal gate disposed on and around the semiconductor channel region;
    a top source drain region above the semiconductor channel region and comprising a first epitaxy region and a second epitaxy region; and
    a dielectric spacer disposed on the metal gate beneath the second epitaxy region, the dielectric spacer contacts vertical sidewalls of the metal gate and vertical sidewalls of the first epitaxy region.

7. The semiconductor structure according to claim 6, wherein the dielectric spacer separates the metal gate from the top source drain region.

8. The semiconductor structure according to claim 6, wherein a first portion of the dielectric spacer comprises a first height, and a second portion of the dielectric spacer comprises a second height.

9. The semiconductor structure according to claim 6, further comprising:
    a bottom spacer separating the bottom source drain region from the metal gate.

10. The semiconductor structure according to claim 6, wherein a width of the first epitaxy region of the top source drain region is substantially equal to a width of the semiconductor channel region, and wherein a width of the second epitaxy region of the top source drain region is larger than the width of the semiconductor channel region.

11. The semiconductor structure according to claim 6, further comprising:
    sidewall spacers disposed along vertical sidewalls of the second epitaxy region and separating the second epitaxy region from an interlevel dielectric layer.

12. The semiconductor structure according to claim 6, further comprising:
    a contact on the second epitaxy region.

13. The semiconductor structure according to claim 6, wherein the first epitaxy region has a dopant concentration of at least about $5 \times 10^{21}$ atoms/cm$^3$, and the second epitaxy region has a dopant concentration of at least about $4 \times 10^{20}$ atoms/cm$^3$.

14. A semiconductor structure comprising:
    a bottom source drain region arranged on a substrate;
    a semiconductor channel region extending vertically upwards from a top surface of the bottom source drain region;
    a metal gate disposed on and around the semiconductor channel region; and a top source drain region above the semiconductor channel region and comprising a first doped epitaxy region and a second doped epitaxy region above the first doped epitaxy region, wherein the second doped epitaxy comprises a lower dopant concentration than the first doped epitaxy region.

15. The semiconductor structure according to claim 14, further comprising:
a bottom spacer separating the bottom source drain region from the metal gate.

16. The semiconductor structure according to claim 14, wherein a width of the first doped epitaxy region of the top source drain region is substantially equal to a width of the semiconductor channel region, and wherein a width of the second doped epitaxy region of the top source drain region is larger than the width of the semiconductor channel region.

17. The semiconductor structure according to claim 14, further comprising:
sidewall spacers disposed along vertical sidewalls of the second doped epitaxy region and separating the second epitaxy doped region from an interlevel dielectric layer.

18. The semiconductor structure according to claim 14, further comprising:
a contact on the second doped epitaxy region.

19. The semiconductor structure according to claim 14, further comprising:
a dielectric spacer disposed on the metal gate beneath the second epitaxy region, the dielectric spacer contacts vertical sidewalls of the metal gate and vertical sidewalls of the first epitaxy region.

20. The semiconductor structure according to claim 1, further comprising:
a dielectric spacer disposed on the metal gate beneath the second epitaxy region, the dielectric spacer contacts vertical sidewalls of the metal gate and vertical sidewalls of the first epitaxy region.

* * * * *